(12) United States Patent
Chang et al.

(10) Patent No.: US 11,841,541 B2
(45) Date of Patent: Dec. 12, 2023

(54) PACKAGE ASSEMBLY AND MANUFACTURING METHOD THEREOF

(71) Applicant: Taiwan Semiconductor Manufacturing Co., Ltd., Hsinchu (TW)

(72) Inventors: Chih-Chieh Chang, Hsinchu (TW); Chung-Hao Tsai, Changhua County (TW); Chen-Hua Yu, Hsinchu (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 571 days.

(21) Appl. No.: 16/882,773

(22) Filed: May 26, 2020

(65) Prior Publication Data

US 2021/0096310 A1 Apr. 1, 2021

Related U.S. Application Data

(60) Provisional application No. 62/906,715, filed on Sep. 26, 2019.

(51) Int. Cl.
*G02B 6/42* (2006.01)
*H01L 21/48* (2006.01)
(Continued)

(52) U.S. Cl.
CPC ......... *G02B 6/4274* (2013.01); *G02B 6/4202* (2013.01); *G02B 6/4239* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 23/5389* (2013.01); *H01L 24/09* (2013.01); *H01L 24/20* (2013.01); *H01L 25/167* (2013.01); *H01L 2224/214* (2013.01)

(58) Field of Classification Search
CPC ............ H01L 21/4857; H01L 23/5383; H01L 23/5389; H01L 25/167; H01L 23/5386; G02B 6/4202
See application file for complete search history.

(56) References Cited

U.S. PATENT DOCUMENTS 8,993,380 B2  3/2015 Hou et al.
9,281,254 B2  3/2016 Yu et al.
(Continued)

FOREIGN PATENT DOCUMENTS

CN          112447654 A  *  3/2021  ......... H01L 21/4853

*Primary Examiner* — Antonio B Crite
(74) *Attorney, Agent, or Firm* — JCIPRNET

(57) ABSTRACT

A package assembly and a manufacturing method thereof are provided. The package assembly includes a first package component and an optical signal port disposed aside the first package component. The first package component includes a first die including an electronic integrated circuit, a first insulating encapsulation laterally covering the first die, a redistribution structure disposed on the first die and the first insulating encapsulation, and a second die including a photonic integrated circuit and electrically coupled to the first die through the redistribution structure. The optical signal port is optically coupled to an edge facet of the second die of the first package component.

20 Claims, 39 Drawing Sheets

(51) Int. Cl.
*H01L 21/56* (2006.01)
*H01L 23/538* (2006.01)
*H01L 25/16* (2023.01)
*G02B 6/43* (2006.01)
*H01L 23/31* (2006.01)
*H01L 23/00* (2006.01)
H01L 23/498 (2006.01)
H01L 21/683 (2006.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2020/0313390 A1* | 10/2020 | Siriani .................. H01S 5/1064 |

\* cited by examiner

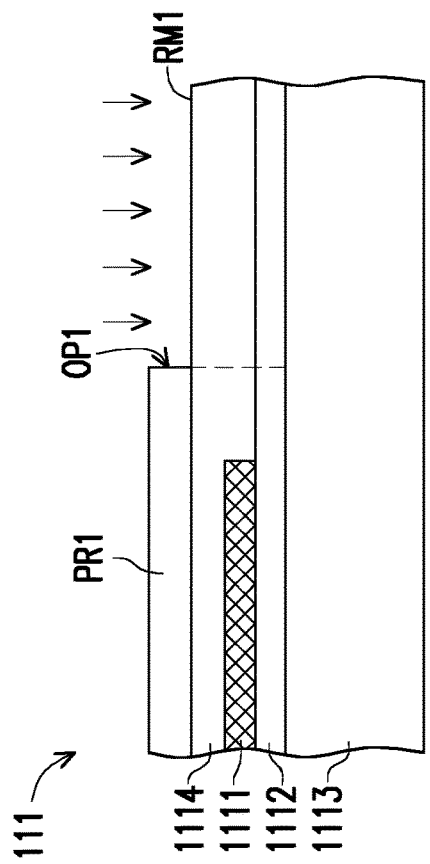
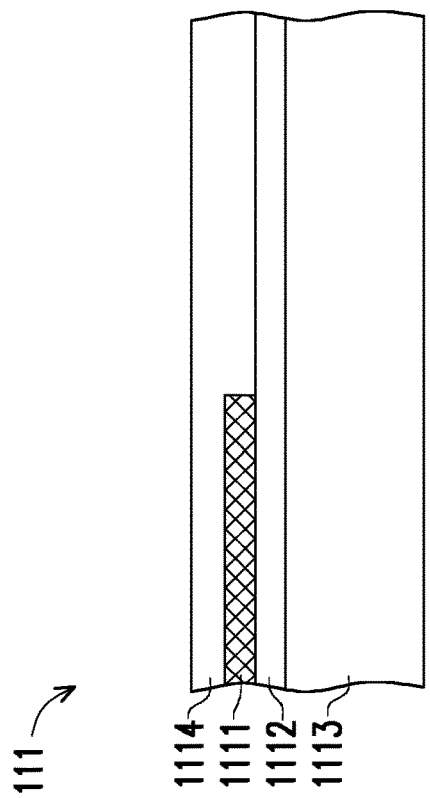
FIG. 8B
FIG. 8A

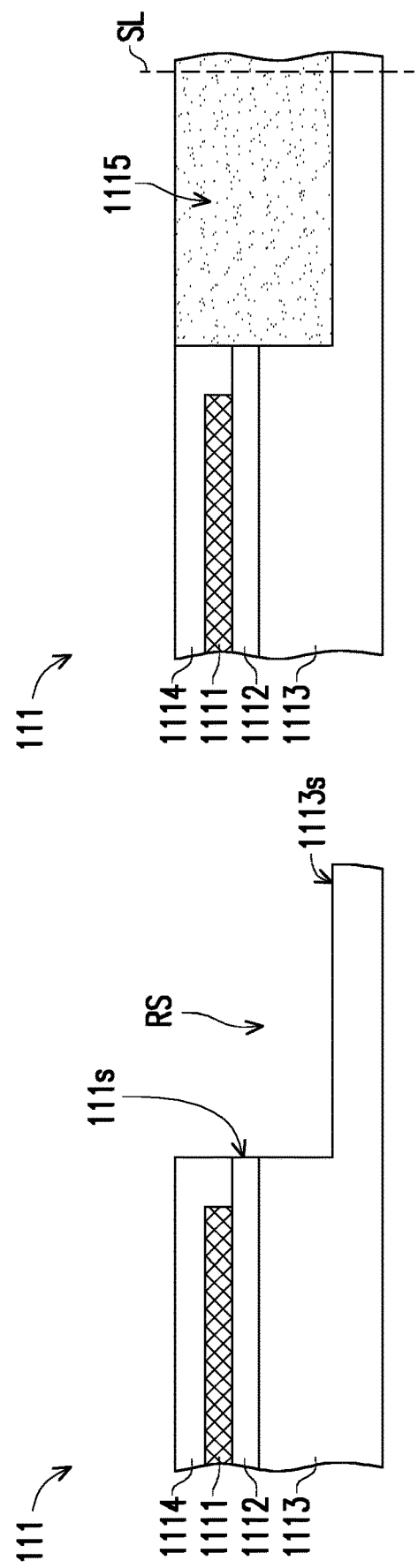

PACKAGE ASSEMBLY AND MANUFACTURING METHOD THEREOF

CROSS-REFERENCE TO RELATED APPLICATION

This application claims the priority benefit of U.S. provisional application Ser. No. 62/906,715, filed on Sep. 26, 2019. The entirety of the above-mentioned patent application is hereby incorporated by reference herein and made a part of this specification.

BACKGROUND

Currently, semiconductor packages including both photonic dies (known as P-dies) and electronic dies (known as E-dies) are becoming increasingly popular for their compactness. In addition, due to the widely use of optical fiber-related applications for signal transmission, optical signaling and processing have been used in more applications. Although existing methods of fabricating the semiconductor packages have been generally adequate for their intended purposes, they have not been entirely satisfactory in all respects. For example, challenges rise to develop robust processes for interconnecting among P-dies, E-dies, and optical fibers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8F are partially cross-sectional views of various stages of manufacturing a photonic die in accordance with some embodiments.

DETAILED DESCRIPTION

Figure 1A:
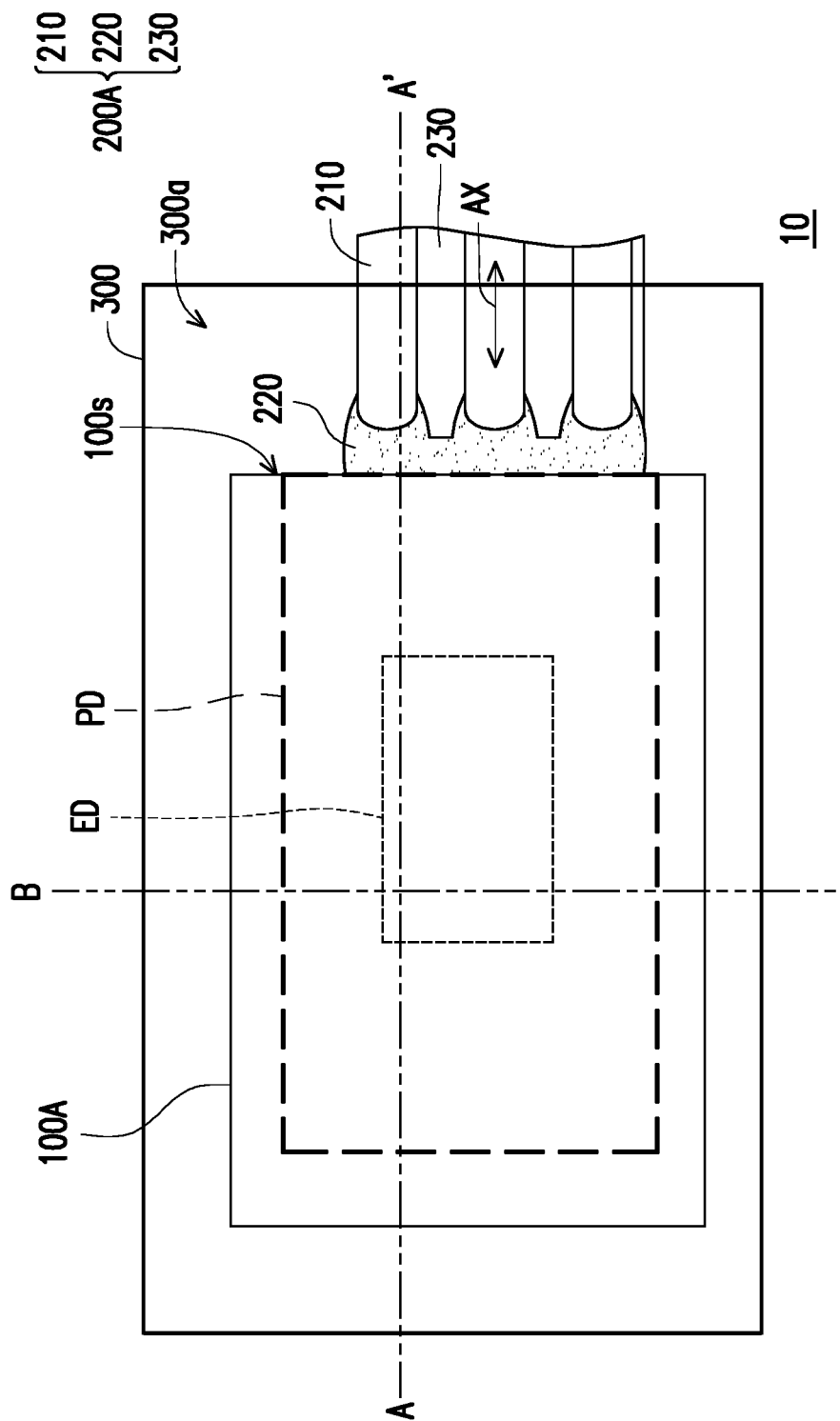
FIG. 1A is a schematic top view of a package assembly in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure are discussed in the context of semiconductor manufacturing, and in particular, in the context of forming a package assembly, wherein the package assembly includes a package component having a photonic die and an electronic die, and an optical signal port optically coupled to the photonic die of the package component. Some variations of embodiments are discussed and the intermediate stages of forming the package assembly are illustrated in accordance with some embodiments. It should be appreciated that the illustration throughout the drawings are schematic and not in scale.

Figure 1B:
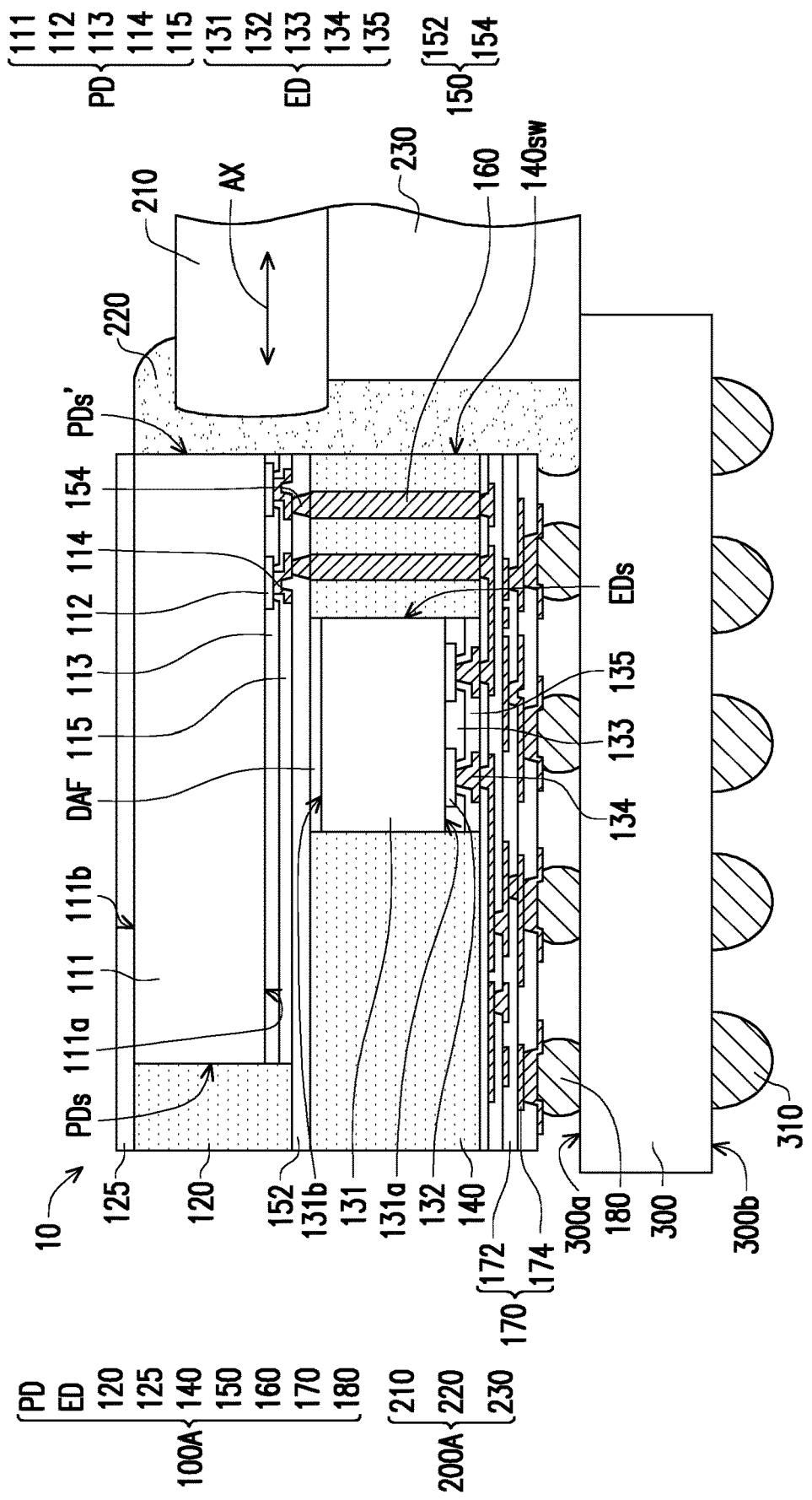
FIGS. 1B and 1C are schematic cross-sectional views respectively taken along an A-A' line and a B-B' line illustrated in FIG. 1A in accordance with some embodiments.
Figure 1C:
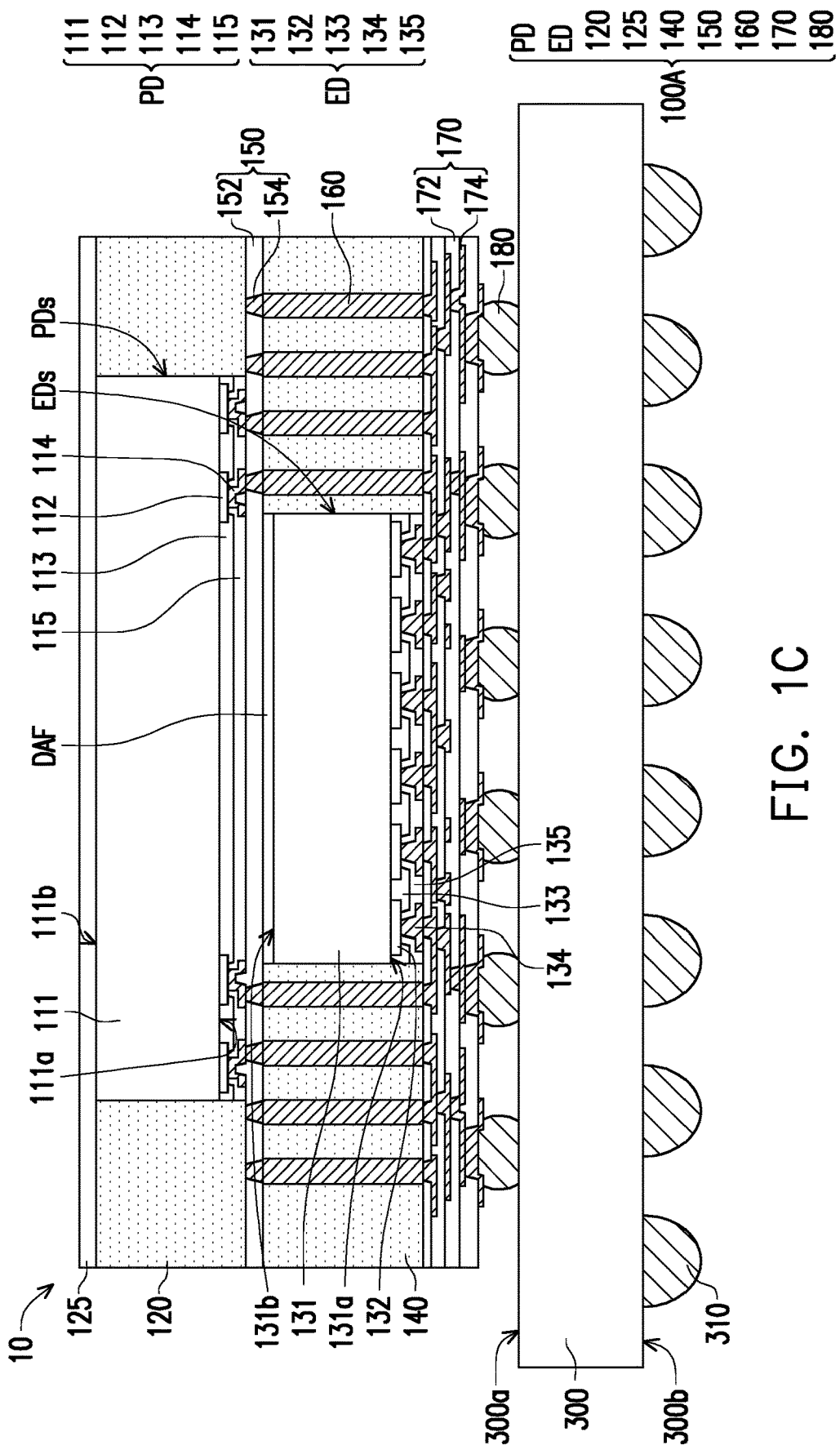

FIG. 1A is a schematic top view of a package assembly in accordance with some embodiments, and FIGS. 1B and 1C are schematic cross-sectional views respectively taken along an A-A' line and a B-B' line illustrated in FIG. 1A in accordance with some embodiments. Referring to FIGS. 1A-1C, a package assembly 10 includes a first package component 100A and an optical signal port 200A facing an outer sidewall 100s of the first package component 100A and optically coupled to the first package component 100A.

In some embodiments, the optical signal port 200A is an optical input/output (I/O) port where optical signals may enter and/or exit. For example, the optical signal port 200A includes at least one fiber 210 and an optical interface layer 220 interposed between the fiber 210 and the first package component 100A for bonding the fiber 210 to the first package component 100A. In some embodiments, at least the end portion of the fiber 210 is inserted into the optical interface layer 220. In some embodiments, a plurality of fibers 210 is arranged in a parallel manner to form a fiber array module. For example, the fiber 210 may be a lensed fiber in which a lens shape for an optical connection is formed at a tip portion facing the outer sidewall 100s of the first package component 100A. In some embodiments, a fiber mesa 230 is configured to abut against the fibers 210 to support or secure the fibers 210. Alternatively, the fiber mesa 230 is omitted.

In some embodiments, the fibers 210 are bonded to the first package component 100A by applying the optical interface layer 220 to the end portions of the fibers 210 and the outer sidewall 100s of the first package component 100A. For example, the optical interface layer 220 includes clear (or transparent) adhesive or other suitable optical glue/grease. In some embodiments, the optical interface layer 220 is facilitated by the optical adhesive to provide optical transparency and mechanical fixation. In some embodiments, the optical interface layer 220 is a layer of index-matching adhesive. For example, the optical interface layer 220 is index-matched to the fibers 210 and to the outer sidewall 100s of the first package component 100A to reduce optical loss. The refractive index and the thickness of the optical interface layer 220 may be adjusted according to the refractive indices of the fibers 210 and the first package component 100A. The optical interface layer 220 may be a single-layer or multi-layer structure. The material of the optical interface layer 220 may include an epoxy based compound, a silicone based compound, an acrylic based compound, a combination thereof, or the like.

In some embodiments, IC packaging techniques, such as integrated fanout (InFO) packaging techniques, are used to fabricate the first package component 100A. Other packaging techniques may be used to form the first package component 100A. For example, the first package component 100A includes at least one photonic die PD and at least one electronic die ED electrically coupled to the photonic die PD. It is noted that the photonic die PD and the electronic die ED are illustrated in phantom in the top view to indicate that they may be covered. It is also noted that the size, the number, and the configuration of the photonic die PD and/or the electronic die ED are depicted for illustration purpose only.

In some embodiments, the photonic die PD may include photonic integrated circuit to process, receive, and/or transmit optical signals. In some embodiments, the fibers 210 are aligned with the photonic die PD to enable exchange of optical signals between the photonic die PD and the fibers 210. In some embodiments, the photonic die PD may convert electrical signals from the electronic die ED to optical signals. In some embodiments, the photonic die PD may convert optical signals from the optical signal port 200A to electrical signals. In some embodiments, the photonic die PD includes active and/or passive optical devices responsible for the I/O of optical signals to/from the optical signal port 200A. The active and/or passive optical devices may include I/O couplers, edge couplers, lasers, optical modulators, detectors, waveguides, splitters, converters, switches, grating couplers, etc. Since the bandwidth of the grating couplers is limited and the grating couplers are polarization dependent, the photonic die PD may be free of grating couplers formed therein in accordance with some embodiments. In some embodiments, the photonic die PD includes at least one edge coupler (111l; shown in FIGS. 8A-9) which has broad bandwidth with small polarization dependent loss.

For example, the fibers 210 are laterally aligned with the edge coupler of the photonic die PD to provide the optical signals. In some embodiments, the fiber axis AX may be substantially parallel to a normal direction of the outer sidewall 100s of the first package component 100A. In some embodiments, an angle (e.g., between a few degrees to about 90 degrees) is formed between the fiber axis AX and the outer sidewall 100s of the first package component 100A. The angle between the fiber axis AX and the outer sidewall 100s may be adjusted depending on the characteristics of the fiber 210 and depending on how well the optical connection is optimized. It is noted that the angle between the fiber axis AX and the outer sidewall 100s construe no limitation in the disclosure. In some embodiments, the fibers 210 are bonded to the edge facet of the outer sidewall 100s corresponding to the edge couplers through the optical interface layer 220. It is noted that the detailed descriptions of the edge couplers of the photonic die PD will be discussed later in accompanying with figures.

Continue to FIGS. 1B-1C, the photonic die PD includes a substrate 111. For example, the substrate 111 may be or may include a bulk silicon substrate, a silicon germanium substrate, or a substrate formed of other semiconductor materials. In some embodiments, the substrate 111 is a semiconductor-on-insulator (SOI) substrate including a layer of a semiconductor material formed on an insulator layer. Other substrate may be used. For example, the substrate 111 includes a top surface 111a and a bottom surface 111b opposing to the top surface 111a. In some embodiments, the photonic die PD includes a plurality of conductive pads 112 distributed over the top surface 111a, a passivation layer 113 formed over the top surface 111a and partially covering the conductive pads 112, a plurality of die connectors 114 formed on the conductive pads 112, and a protection layer 115 formed on the passivation layer 113 and at least laterally covering the die connectors 114. It is noted that the above examples are provided for illustrative purposes only, and other embodiments may utilize fewer or additional elements. For example, additional elements (not shown; e.g., interconnect structure) may be formed on the top surface 111a of the substrate 111 for interconnecting the conductive pads 112.

A material of the conductive pads 112 may include aluminum, but other suitable conductive materials (e.g., copper) may be used. A material of the passivation layer 113 may be or may include silicon oxide, silicon nitride, low-k dielectric materials such as carbon doped oxides, extremely low-k dielectric materials such as porous carbon doped silicon dioxide, a combination thereof or other suitable material. A material of the die connectors 114 may be or may include metal (e.g., copper, silver, tungsten, titanium, gold, etc.), metal alloy, a combination thereof, or other suitable conductive material. A material of the protection layer 115 may be or may include polybenzoxazole (PBO), polyimide, benzocyclobutene (BCB), or other suitable dielectric material.

In some embodiments, the photonic die PD is laterally encapsulated by a first insulating encapsulation 120. For example, the sidewall PDs' of the photonic die PD is covered by the optical interface layer 220, and the first insulating encapsulation 120 extends along other sidewalls PDs of the photonic die PD. The first insulating encapsulation 120 may include a low moisture absorption rate and may be rigid for protecting the photonic die PD. A material of the first insulating encapsulation 120 may be or may include a molding compound (e.g., epoxy resin), a molding underfill, or other suitable electrically insulating material. In some embodiments, a protection layer 125 is formed on the first insulating encapsulation 120 and the bottom surface 111b of the substrate 111 for protection. The protection layer 125 may be or may include a die attach film or other suitable dielectric material(s). Alternatively, the protection layer 125 is omitted.

Still referring to FIGS. 1A-1C, in some embodiments, the photonic die PD and the electronic die ED are stacked upon one another. In some embodiments, the size of the photonic die PD is greater than the size of the electronic die ED. For example, the footprint area occupied by the photonic die PD is greater than the footprint area occupied by the electronic die ED. In some embodiments, as shown in FIG. 1A, the footprint area occupied by the electronic die ED fully overlaps the footprint area occupied by the photonic die PD. In some other embodiments, the footprint area occupied by the electronic die ED partially overlaps the footprint area occupied by the photonic die PD in the top view. For example, the photonic die PD and the electronic die ED are stacked in a staggered manner. In some embodiments, the photonic die PD and the electronic die ED are stacked in a face-to-back manner. For example, the electronic die ED includes a substrate 131 having a top surface 131a and a bottom surface 131b opposing to each other. In some embodiments, the bottom surface 131b of the substrate 131 (which is the back surface of the electronic die ED) and the top surface 111a of the substrate 111 (which is the active surface of the photonic die PD) may face each other, and such configuration may be referred to as a face-to-back configuration.

In some embodiments, the electronic die ED includes electronic integrated circuits for processing the electrical signals converted from the optical signals in the photonic die PD. In some embodiments, the electronic die ED exchanges electrical signals with the photonic die PD. The electronic die ED may be or may include logic IC dies, memory dies, analog IC dies, application-specific IC (ASIC) dies, or the like. In other embodiments, the electronic die ED is a package structure of which a plurality of die components is encapsulated in a packaging encapsulation (not shown). In some embodiments, the photonic die PD is a photonic integrated circuit (PIC) die and the electronic die ED is an electronic integrated circuit (EIC) die.

In some embodiments, the substrate 131 of the electronic die ED may be a silicon substrate or a substrate formed of other semiconductor materials such as germanium, silicon germanium, a III-V compound semiconductor material, or the like. In some embodiments, the bottom surface 131b of the substrate 131 is in contact with a die attach film DAF. For example, the substrate 131 includes a plurality of active/passive devices (not shown) formed thereon. Examples of active components include, but are not limited to, diodes, field effect transistors (FETs), metal-oxide-semiconductor FETs (MOSFETs), complementary metal-oxide-semiconductor (CMOS) transistors, and bipolar transistors. Examples of passive components include, but are not limited to, resistors, capacitors, and inductors.

In some embodiments, the electronic die ED includes a plurality of conductive pads 132 distributed over the top surface 131a, a passivation layer 133 formed over the top surface 111a and partially covering the conductive pads 132, a plurality of die connectors 134 formed on the conductive pads 132, and a protection layer 135 formed on the passivation layer 133 and at least laterally covering the die connectors 134. The conductive pads 132 and the die connectors 134 formed on the conductive pads 132 may be electrically coupled to the active/passive devices through an interconnect structure (not shown). Materials of the conductive pads 132, the passivation layer 133, the die connectors 134, and the protection layer 135 may be respectively similar to the materials of the conductive pads 112, the passivation layer 113, the die connectors 114, and the protection layer 115, and the detailed descriptions are omitted for the sake of brevity.

In some embodiments, the electronic die ED is laterally encapsulated by a second insulating encapsulation 140. For example, the second insulating encapsulation 140 extends along the sidewalls EDs of the electronic die ED. The sidewall PDs' of the photonic die PD is substantially leveled with a sidewall 140sw of the first insulating encapsulation 140. A material of the second insulating encapsulation 140 may be similar to that of the first insulating encapsulation 120, and the detailed descriptions are omitted for the sake of brevity. In some embodiments, a first redistribution structure 150 including a first patterned dielectric layer 152 and a first patterned conductive layer 154 is interposed between the electronic die ED and the photonic die PD. For example, the first patterned dielectric layer 152 is formed on the photonic die PD and the first insulating encapsulation 120, and a plurality of openings (not labeled) of the first patterned dielectric layer 152 may accessibly expose the die connectors 114 of the photonic die PD. For example, the first patterned dielectric layer 152 may be formed of PBO, polyimide, BCB, or the like. In some embodiments, the electronic die ED is attached to the first patterned dielectric layer 152 through the die attach film DAF. The first patterned conductive layer 154 may be formed in the openings of the first patterned dielectric layer 152 to be in physical and electrical contact with the die connectors 114 of the photonic die PD. For example, the first patterned conductive layer 154 is formed of a conductive material, which may be a metallic material such as tungsten, copper, titanium, or the like.

In some embodiments, a plurality of through insulating vias (TIVs) 160 penetrate through the second insulating encapsulation 140 and may be disposed aside the electronic die ED. In some embodiments, the electronic die ED is surrounded by the TIVs 160. The TIVs 160 may be in physical and electrical contact with the first patterned conductive layer 154 of the first redistribution structure 150. The TIVs 160 may be formed of conductive material, such as tungsten, copper, titanium, or the like.

In some embodiments, a second redistribution structure 170 including a second patterned dielectric layer 172 and a second patterned conductive layer 174 is formed on the electronic die ED, the second insulating encapsulation 140, and the TIVs 160. For example, the second patterned dielectric layer 172 is formed on the electronic die ED, the second insulating encapsulation 140, and the TIVs 160, and a plurality of openings (not labeled) of the second patterned dielectric layer 172 may accessibly expose the TIVs 160 and the die connectors 134 of the electronic die ED. The second patterned conductive layer 174 may be formed in the openings of the second patterned dielectric layer 172 to be in physical and electrical contact with the TIVs 160 and the die connectors 134 of the electronic die ED. Materials of the second patterned dielectric layer 172 and the second patterned conductive layer 174 may be similar to those of the first patterned dielectric layer 152 and the first patterned conductive layer 154, respectively. The details thereof are not repeated for the sake of brevity.

For example, the electronic die ED is in electrical communication with the photonic die PD through the second redistribution structure 170, the TIVs 160, and the first redistribution structure 150. In this manner, optimal integration including high-speed and low power operation may be achieved. In some embodiments, the second patterned conductive layer 174 includes under bump metallization (UBM) patterns at least partially exposed by the second patterned dielectric layer 172 for further electrical connection. In some embodiments, a plurality of conductive terminals 180 are formed on the second patterned conductive layer 174 (e.g., UBM patterns). The conductive terminals 180 may be or may include ball grid array (BGA) connectors, solder balls, metal pillars, controlled collapse chip connection (C4) bumps, micro bumps, electroless nickel-electroless palladium-immersion gold (ENEPIG) formed bumps, or the like.

Continue to FIGS. 1A-1C, in some embodiments, the package assembly 10 further includes a second package component 300, and the first package component 100A may be mounted on and electrically coupled to the second package component 300. The second package component 300 may be or may include a package substrate, a printed circuit board (PCB), a printed wiring board, an interposer, and/or other circuit carrier that is capable of carrying integrated circuits. In some embodiments, the conductive terminals 180 of the first package component 100A are disposed on the top surface 300a of the second package component 300, and a plurality of external terminals 310 are distributed on the bottom surface 300b of the second package component 300 for further electrical connection. In some embodiments, the size and the spacing of the external terminals 310 are greater than those of the conductive terminals 180 of the first package component 100A. In some other embodiments, the external terminals 310 are omitted. For example, the package assembly 10 is mounted on a mother board through the external terminals 310. Other applications of the package assembly 10 may be possible.

In some embodiments, the optical signal port 200A coupled to the first package component 100A is disposed on the top surface 300a of the second package component 300. For example, the optical interface layer 220 bonding the fiber 210 to first package component 100A covers a portion of the top surface 300a of the second package component 300. In some embodiments, the fibers 210 are arranged to lean against the fiber mesa 230, and the fibers 210 and the second package component 300 are spatially apart from one other via the fiber mesa 230. In alternative embodiments, the fiber mesa 230 is omitted.

Figure 2A:
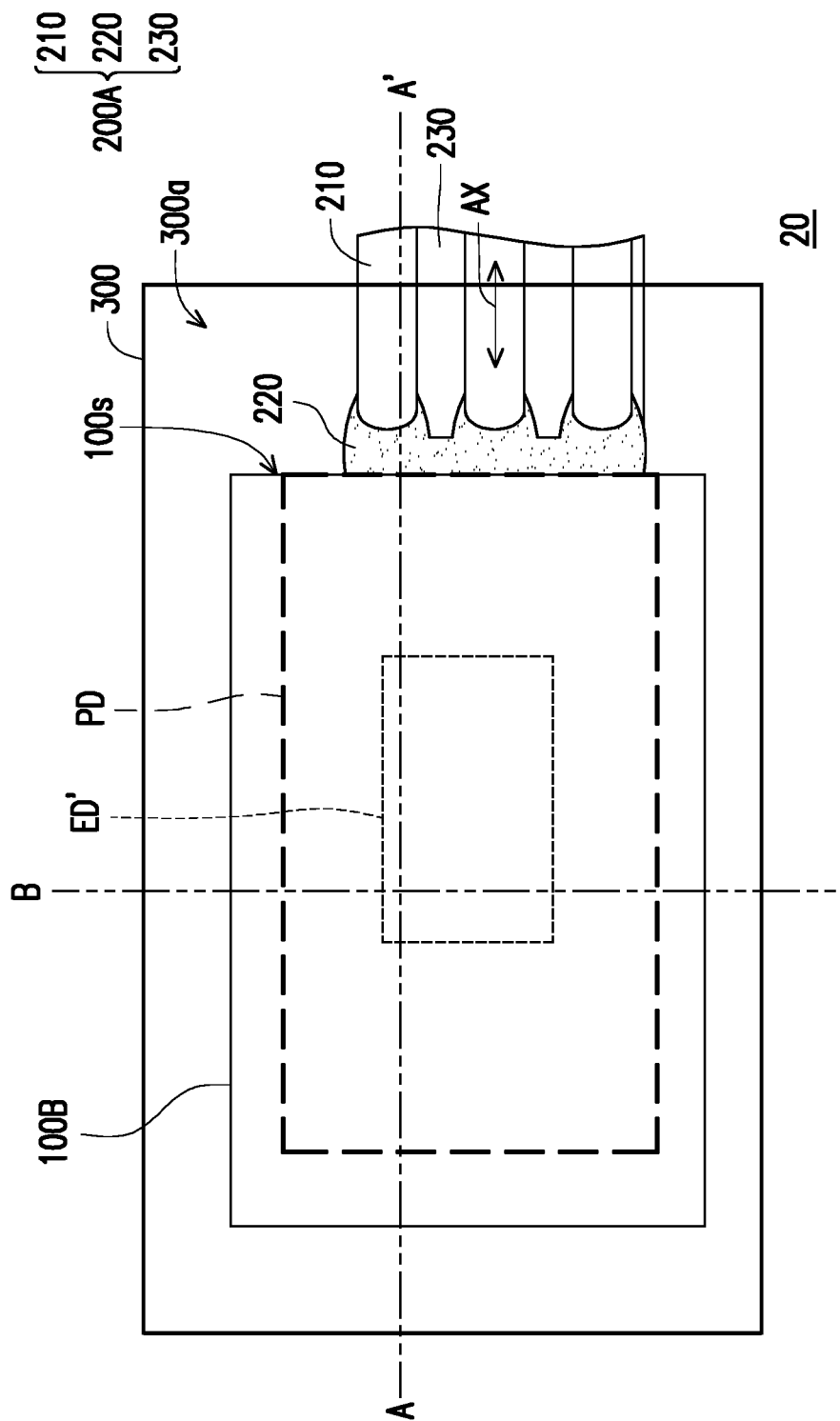
FIG. 2A is a schematic top view of a package assembly in accordance with some embodiments.
Figure 2B:
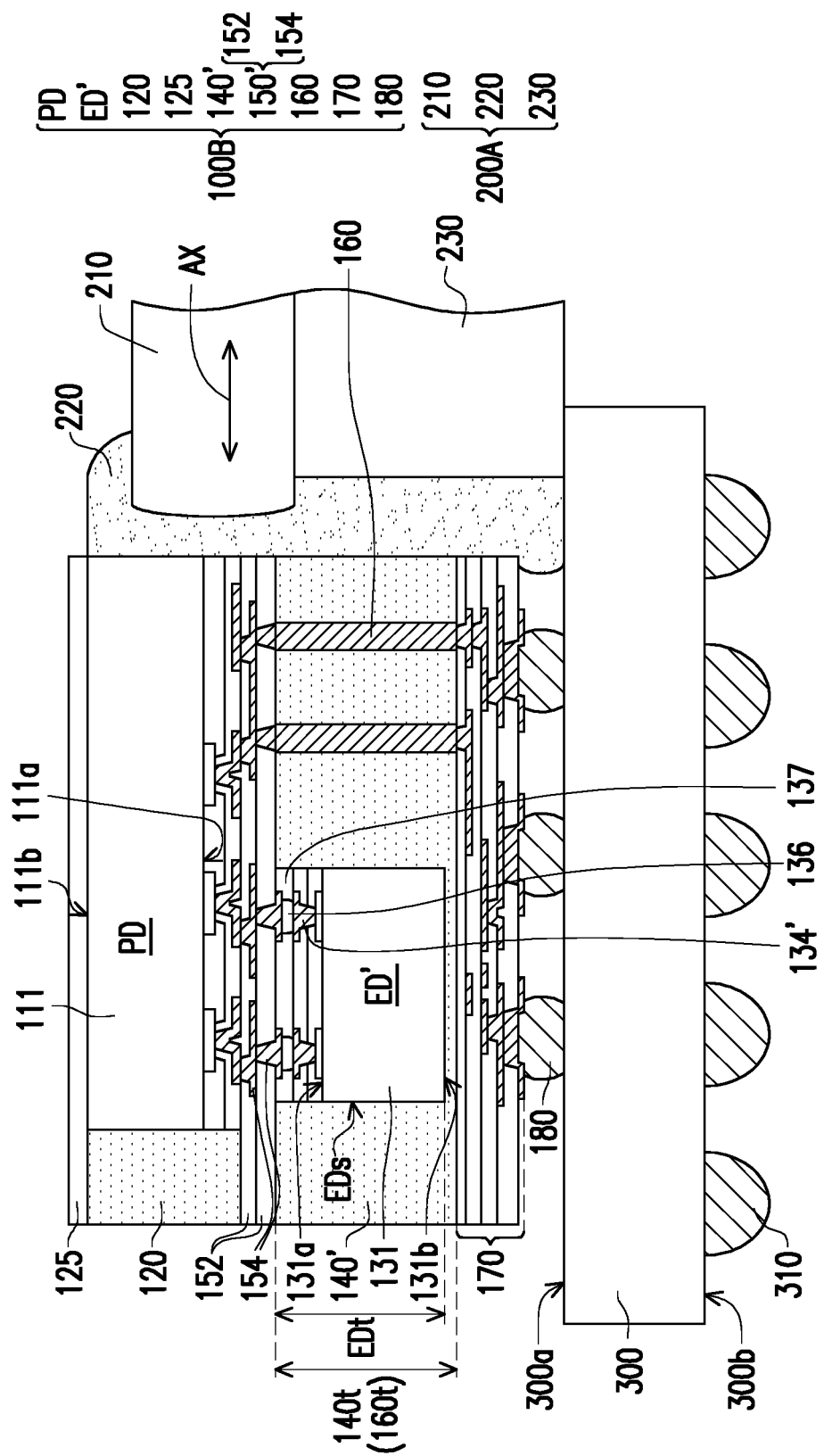
FIGS. 2B and 2C are schematic cross-sectional views respectively taken along an A-A' line and a B-B' line illustrated in FIG. 2A in accordance with some embodiments.
Figure 2C:
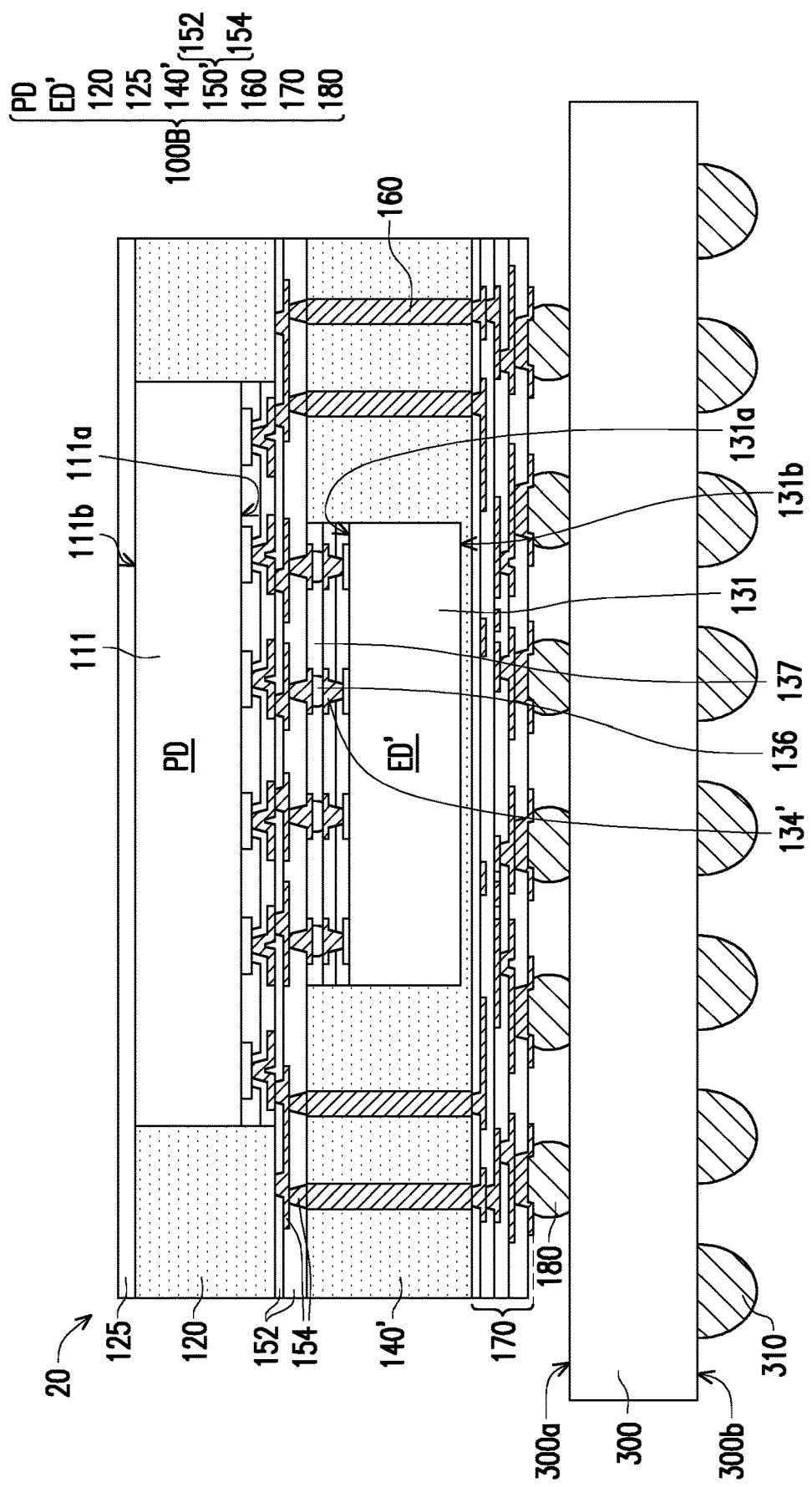

FIG. 2A is a schematic top view of a package assembly in accordance with some embodiments, and FIGS. 2B and 2C are schematic cross-sectional views respectively taken along an A-A' line and a B-B' line illustrated in FIG. 2A. in accordance with some embodiments. Referring to FIGS. 2A-2C, a package assembly 20 including a first package component 100B and the optical signal port 200A optically coupled to the first package component 100B. The second package component 300 is optionally disposed beneath the first package component 100B and the optical signal port 200A. The second package component 300 may be electrically coupled to the first package component 100B. The package assembly 20 described with reference to FIGS. 2A-2C may be similar to the package assembly 10 described with reference to FIGS. 1A-1C. Only the differences therebetween will be discussed, the like or the same part will not be repeated again, and the like numeral references indicate the like elements.

For example, the difference between the package assembly 20 and the package assembly 10 lies in the first package component 100B. In some embodiments, the first package component 100B includes the photonic die PD and the electronic die ED' stacked upon one another in a face-to-face manner. For example, the top surface 131a of the substrate 131 (which is the active surface of the electronic die ED') and the top surface 111a of the substrate 111 (which is the active surface of the photonic die PD) may face each other, and such configuration may be referred to as a face-to-face configuration. In this manner, a short electrical signal path between the photonic die PD and the electronic die ED' is achieved, thereby minimizing a noise between operations and improving signal performance.

In some embodiments, the first redistribution structure 150' interposed between the electronic die ED' and the photonic die PD is formed as a multi-layer structure including a plurality of first patterned dielectric layers 152 and a plurality of first patterned conductive layers 154 alternately stacked. The numbers of layers of the first redistribution structure 150' may be adjusted depending on the circuit design. In some embodiments, the first redistribution structure 150' is referred to as a die-to-die interconnection. In some embodiments, the electrical signals the electronic die ED' may be transmitted to/from the second package component 300 through the first redistribution structure 150', the TIVs 160, the second redistribution structure 170, and the conductive terminals 180. In some embodiments, the power introduced from the second package component 300 to the electronic die ED' may be provided through the conductive terminals 180, the second redistribution structure 170, the TIVs 160, and the first redistribution structure 150'.

In some embodiments, the die connectors 134' of the electronic die ED' are coupled to the first patterned conductive layer 154 through a plurality of conductive joints 136. The conductive joints 136 may be or may include microbumps. In some embodiments, the conductive joints 136 include solder material, and the respective die connector 134 and the first patterned conductive layer 154 include metal pads for soldering. In some embodiments, an underfill layer 137 is interposed between the protection layer 135 and the first patterned dielectric layer 152 to laterally cover the connection (e.g., the conductive joints 136 and the first patterned conductive layer 154 connected to the conductive joints 136). Alternatively, the underfill layer 137 is omitted and the second insulating encapsulation 140' fills the gap between the protection layer 135 of the electronic die ED' and the first patterned dielectric layer 152 to laterally cover the connection of the electronic die ED' and the first redistribution structure 150'. In some other embodiments, the conductive joints 136 are omitted, and the electronic die ED' may be coupled to the first redistribution structure 150' using other suitable bonding techniques (e.g., direct surface bonding, metal-to-metal bonding, hybrid bonding, etc.).

Continue to FIG. 2B, in some embodiments, the thickness 140t of the second insulating encapsulation 140' is greater than the thickness EDt of the electronic die ED'. Each of the TIVs 160 passing through the second insulating encapsulation 140' may have the thickness 160t greater than the thickness EDt of the electronic die ED'. For example, the second insulating encapsulation 140' covers the sidewalls EDs of the electronic die ED' and extends to cover the bottom surface 131b of the substrate 131. In some other embodiments, the bottom surface 131b of the substrate 131 is substantially leveled with the surfaces of the second insulating encapsulation 140' and the TIVs 160. For example, the thickness EDt of the electronic die ED' is substantially equal to the thickness 140t of the second insulating encapsulation 140' and the thicknesses 160t of the TIVs 160.

Figure 3A:
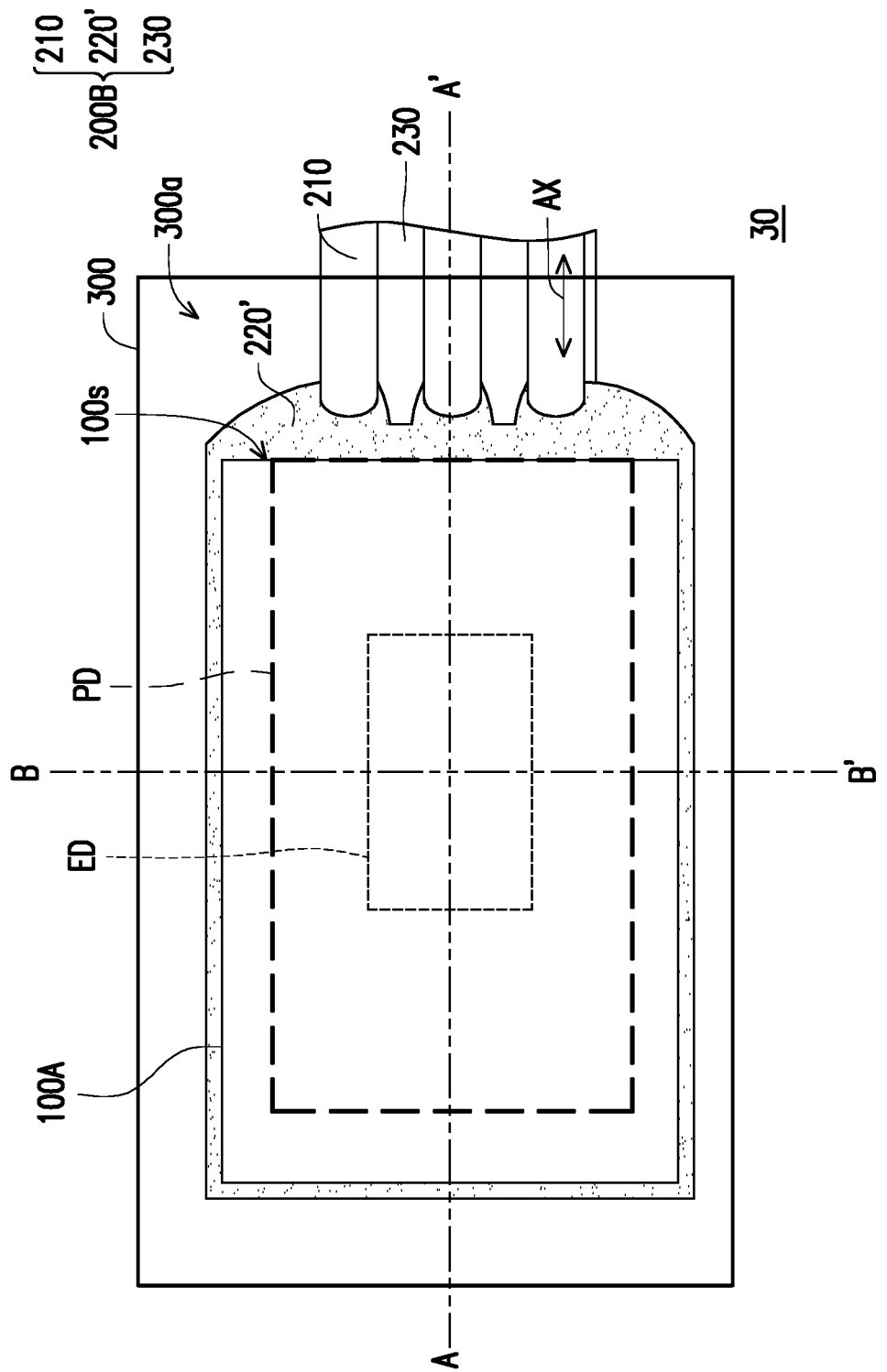
FIG. 3A is a schematic top view of a package assembly in accordance with some embodiments.
Figure 3B:
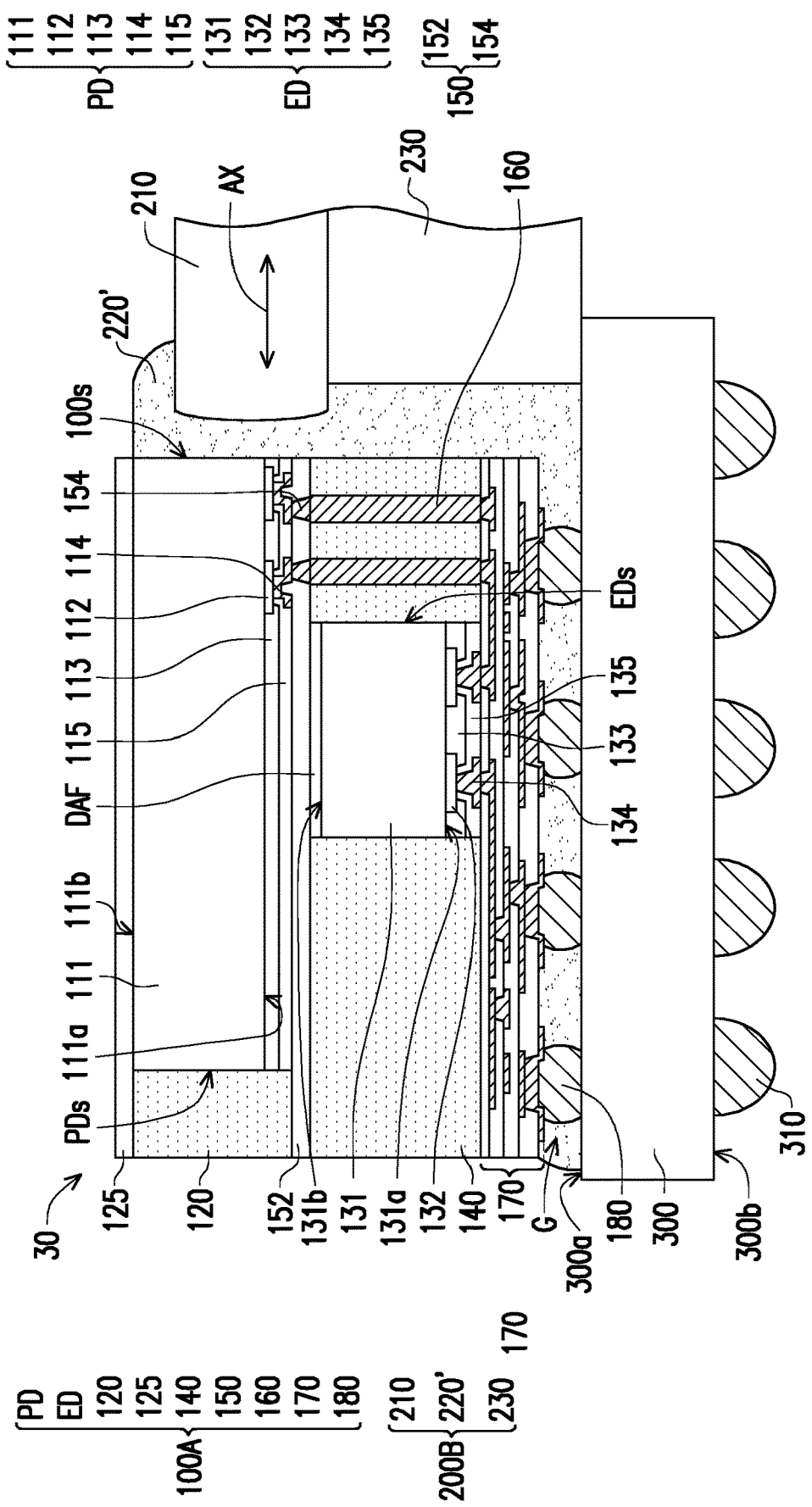
FIGS. 3B and 3C are schematic cross-sectional views respectively taken along an A-A' line and a B-B' line illustrated in FIG. 3A in accordance with some embodiments.
Figure 3C:
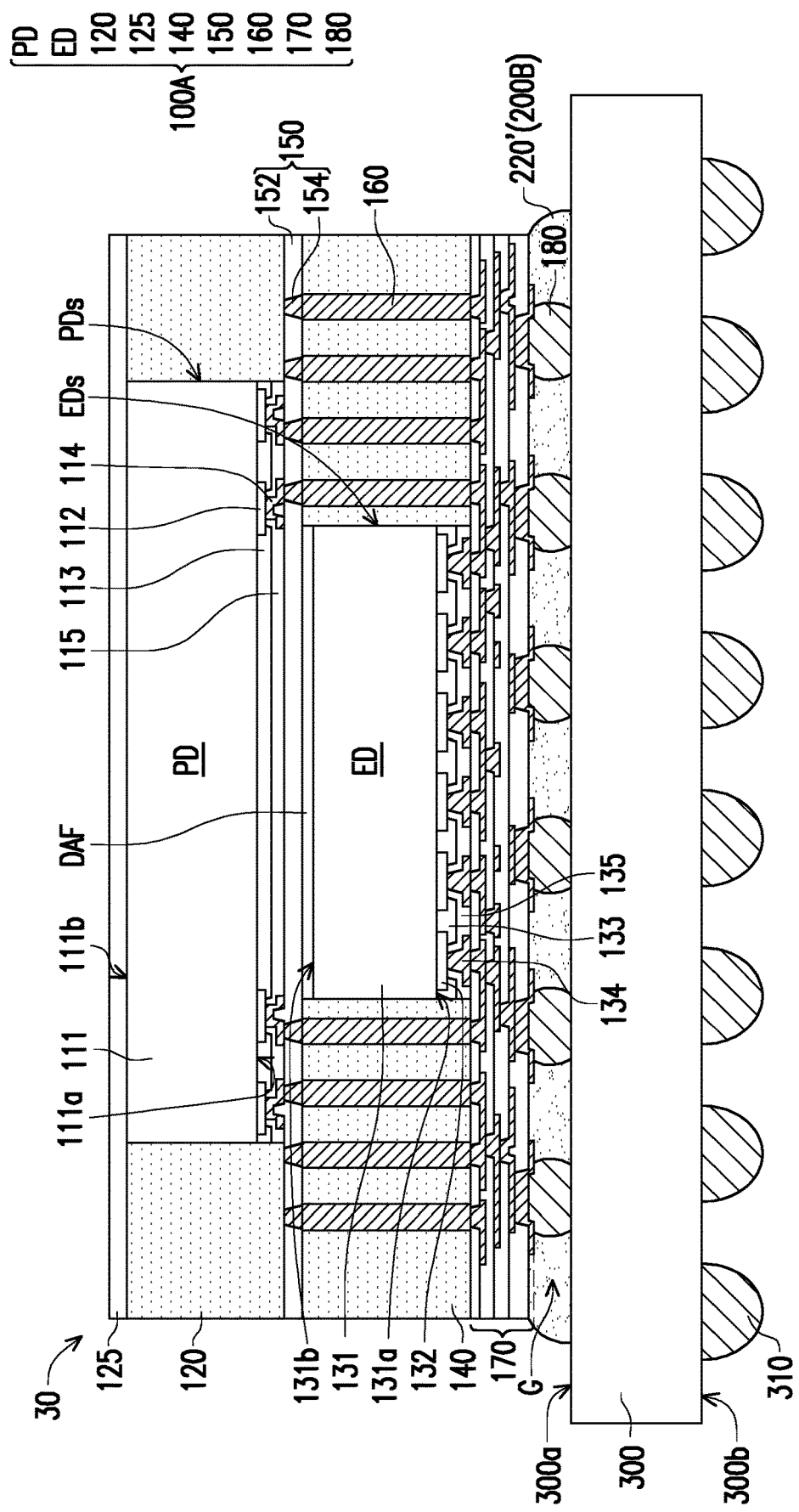

FIG. 3A is a schematic top view of a package assembly in accordance with some embodiments, and FIGS. 3B and 3C are schematic cross-sectional views respectively taken along an A-A' line and a B-B' line illustrated in FIG. 3A in accordance with some embodiments. Referring to FIGS. 3A-3C, a package assembly 30 including the first package component 100A and the optical signal port 200B optically coupled to the first package component 100A. The second package component 300 electrically coupled to the first package component 100A is optionally disposed beneath the first package component 100A and the optical signal port 200B. The package assembly 30 described with reference to FIGS. 3A-3C may be similar to the package assembly 10 described in FIGS. 1A-1C. Only the differences therebetween will be discussed, the like or the same part will not be repeated again, and the like numeral references indicate the like elements.

For example, the difference between the package assembly 20 and the package assembly 10 lies in the optical signal port 200B. In some embodiments, the optical interface layer 220' of the optical signal port 200B covers the outer sidewall 100s of the first package component 100A and further extends into a gap G between the first package component 100A and the second package component 300. For example, a portion of the optical interface layer 220' is interposed between the top surface 300a of the second package component 300 and the second redistribution structure 170 of the first package component 100A. The portion of the optical interface layer 220' may at least laterally cover the conductive terminals 180 of the first package component 100A. In some embodiments, the portion of the optical interface layer 220' serves as an underfill layer for improving the adhesion between the first package component 100A and the second package component 300. The portion of the optical interface layer 220' may be formed by a capillary flow process or may be formed by a suitable deposition method before the first package component 100A is attached to the second package component 300.

In some embodiments, the portion of the optical interface layer 220' may merely fill portions of the gap G, and another underfill layer (not shown) fills the remaining portions of the gap G. In some embodiments, the portion of the optical interface layer 220' filling the gap G may be replaced by another underfill layer (not shown).

In some embodiments, as shown in the top view of FIG. 3A, the area of the optical interface layer 220' covering the top surface 300a of the second package component 300 is greater than the footprint area occupied by the first package component 100A on the top surface 300a of the second package component 300. Alternatively, the area of the optical interface layer 220' covering the top surface 300a of the second package component 300 is substantially equal to or less than the footprint area occupied by the first package component 100A on the top surface 300a of the second package component 300. The area of the optical interface layer 220' covering the top surface 300a may be adjusted by the dispensed amount of the optical interface layer 220'. The disclosure is not limited thereto.

Figure 4A:
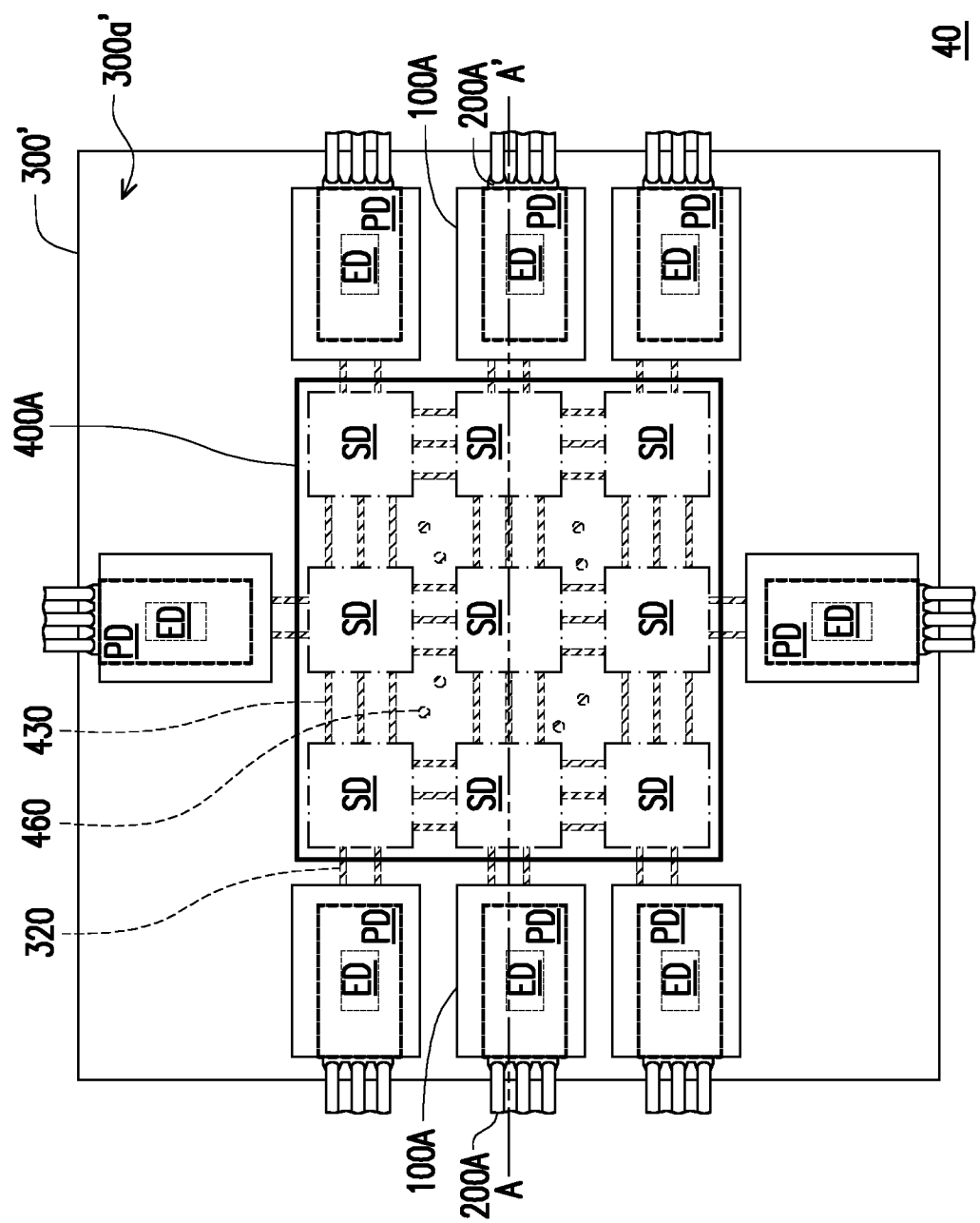
FIG. 4A is a schematic top view of a package assembly in accordance with some embodiments.
Figure 4B:
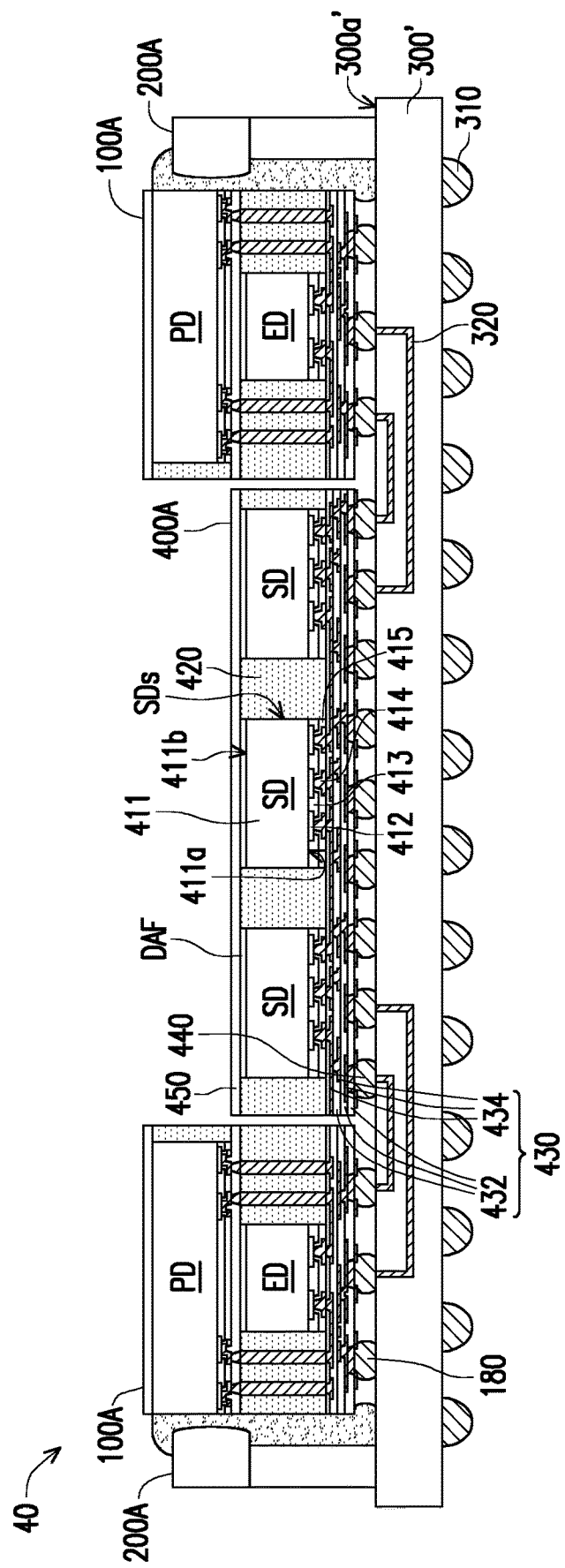
FIG. 4B is schematic cross-sectional view taken along an A-A' line illustrated in FIG. 4A in accordance with some embodiments.

FIG. 4A is a schematic top view of a package assembly in accordance with some embodiments, and FIG. 4B is schematic cross-sectional view taken along an A-A' line illustrated in FIG. 4A in accordance with some embodiments. Unless specified otherwise, the materials of the elements in the embodiments herein are essentially the same as the like elements, which are denoted by like reference numerals in the embodiments shown in FIGS. 1A-3C. The details regarding the materials of the elements hereinafter may be found in the discussion of the embodiments shown in FIGS. 1A-3C.

Referring to FIGS. 4A-4B, a package assembly 40 is provided. For example, the package assembly 40 includes a switch, a hub, a bridge, a router, a communication system, a data center, a network, and/or a computer system (e.g., a multiple-core processor computer system). The package assembly 40 may be a part of an electronic system for such as computers (e.g., high-performance computer), computational devices used in conjunction with an artificial intelligence system, wireless communication devices, computer-related peripherals, and entertainment devices, etc. The package assembly discussed herein may provide broad bandwidth and dense optical signal I/O communication in accordance with some embodiments. It should be noted that other electronic applications are also possible.

Continue to FIGS. 4A-4B, the package assembly 40 includes a main package component 400A, a plurality of first package components 100A surrounding the main package component 400A, and a plurality of optical signal ports 200A optically coupled to the first package components 100A. In some embodiments, the package assembly 40 further includes a second package component 300' electrically coupling the main package component 400A to the first package components 100A. In some embodiments, each of the first package components 100A is electrically coupled to the main package component 400A through a plurality of electrical links 320 of the second package component 300'. It is noted that the electrical links 320 are shown in phantom in FIG. 4A to indicate that they are embedded and may not be seen from the top surface 300a of the second package component 300'.

In some embodiments, a portion of the first package components 100A is disposed side by side along one edge of the second package component 300'. For example, the portion of the first package components 100A is spatially separated from one another in the top view. In some embodiments, each of the first package components 100A is separated from the main package component 400A by a lateral distance. For example, the lateral distance is non-zero. It is noted that the lateral distance may depend on product requirements and may construe no limitation in the disclosure. In some embodiments, the first package components 100A and the optical signal ports 200A are similar to the first package component 100A and the optical signal ports 200A described in FIGS. 1A-1C. In some embodiments, the first package components 100A of the package assembly 40 are partially or entirely replaced with the first package component 100B described in FIGS. 2A-2C. In some embodiments, the optical signal ports 200A of the package assembly 40 may be partially or entirely replaced with the optical signal ports 200B described in FIGS. 3A-3C. It is understood that the first package component and the optical signal port illustrated herein are examples, and variations thereof may be carried out while still remaining within the scope of the claims and disclosure.

In some embodiments, IC packaging techniques, such as integrated fanout (InFO) packaging techniques, are used to fabricate the main package component 400A. Other packaging techniques may be used to form the main package component 400A. For example, the main package component 400A includes at least one semiconductor die SD, a main insulating encapsulation 420 extending along the sidewalls SDs of the semiconductor die SD to laterally cover the semiconductor die SD, a main redistribution structure 430 disposed on the semiconductor die SD and the main insulating encapsulation 420, a plurality of conductive terminals 440 disposed on the main redistribution structure 430 opposite to the semiconductor die SD. For example, the semiconductor die SD is electrically coupled to the conductive terminals 440 through the main redistribution structure 430. In some embodiments, a protection layer 450 is disposed on the semiconductor die SD and the main insulating encapsulation 420 that are opposite to the main redistribution structure 430. In some embodiments, the semiconductor die SD is attached to the protection layer 450 through the die attach film DAF. Alternatively, the protection layer 450 and/or the die attach film DAF may be omitted. In some embodiments, a plurality of main TIVs 460 (shown in FIG. 4A) is formed aside the semiconductor dies SD to be electrically connected to the main redistribution structure 430. In some embodiments, the main TIVs 460 may penetrate through the main insulating encapsulation 420 to provide vertically electrical path. Other circuitry may be used as appropriate for a given application. The above examples are provided for illustrative purposes only, and other embodiments may utilize fewer or additional elements.

In some embodiments, a plurality of semiconductor dies SD is arranged in an array and the main insulating encapsulation 420 may encapsulate the semiconductor dies SD. Although nine semiconductor dies SD are shown in the top view of FIG. 4A, it is noted that the number, the shape and the size of the semiconductor dies SD construe no limitation in the disclosure. In some other embodiments, a single semiconductor die SD is included in the main package component 400A. It is appreciated that the semiconductor dies SD are illustrated in phantom in FIG. 4A to indicate that they may be covered. In some embodiments, the semiconductor dies SD include routers, switches, and/or processor cores for processing electrical signals. For example, electrical signals generated in the semiconductor dies SD may be used to drive the first package components 100A. In some embodiments, the semiconductor dies SD may be or may include logic dies (e.g., central processing unit (CPU), graphics processing unit (GPU), system-on-a-chip (SoC), microcontroller, etc.), application-specific integrated circuit (ASIC) dies, memory dies (e.g., dynamic random access memory (DRAM) dies, static random access memory (SRAM) dies, etc.), power management dies (e.g., power management integrated circuit (PMIC) dies), radio frequency dies, sensor dies, micro-electro-mechanical-system (MEMS) dies, signal processing dies (e.g., digital signal processing die), the like, or a combination thereof. For example, the main package component 400A with the semiconductor dies SD may include a processing subsystem (with one or more processor dies) and a memory subsystem (with memory dies). In some embodiments, the main package component 400A includes one or more program modules or sets of instructions stored in the memory subsystem, which may be executed by processing subsystem during operation.

Continue to FIG. 4B, for example, each of the semiconductor dies SD includes a substrate 411 having a top surface 411a and a bottom surface 411b, a plurality of conductive pads 412 distributed over the top surface 411a, a passivation layer 413 formed over the top surface 411a and partially covering the conductive pads 412, a plurality of die connectors 414 formed on the conductive pads 412, and a protection layer 415 formed on the passivation layer 413 and at least laterally covering the die connectors 414. In some embodiments, the substrate 411 includes a plurality of active/passive devices (not shown) formed thereon to perform one or more functions. The functions may include memory structures, processing structures, sensors, amplifiers, power distribution, I/O circuitry, or the like. Materials of the substrate 411, the conductive pads 412, the passivation layer 413, the die connectors 414, and the protection layer 415 may be respectively similar to the materials of the substrate 131, the conductive pads 132, the passivation layer 133, the die connectors 134, and the protection layer 135 of the electronic die ED described in FIGS. 1B-1C, and the detailed descriptions are omitted for the sake of brevity. A material of the main insulating encapsulation 420 may be similar to the material of the first insulating encapsulation 120 (or the second insulating encapsulation 140), and the detailed descriptions are also omitted. In some embodiments, the main redistribution structure 430 includes a plurality of patterned dielectric layers 432 and a plurality of patterned conductive layers 434 alternately stacked. The main redistribution structure 430 and the conductive terminals 440 formed on the main redistribution structure 430 may be similar to the second redistribution structure 170 and the conductive terminals 180 described in FIGS. 1B-1C, and the detailed descriptions are also omitted.

In some embodiments, the main package component 400A and the first package components 100A are mounted on the top surface 300a' of the second package component 300' through the conductive terminals 180 and 440, respectively. The second package component 300' may be or may include a printed circuit board (PCB), a printed wiring board, a package substrate, an interposer, and/or other circuit carrier that is capable of carrying integrated circuits. In some embodiments, the conductive terminals 180 of each of the first package components 100A are disposed on the peripheral region of the top surface 300a' of the second package component 300', and the conductive terminals 440 of the main package component 400A are disposed on the central region of the top surface 300a' of the second package component 300'. For example, the respective first package component 100A has one edge optically coupled to the corresponding optical signal port 200A and an opposing edge facing the main package component 400A. This configuration enables broad bandwidth and a greater number of optical signal I/O.

Figure 5A:
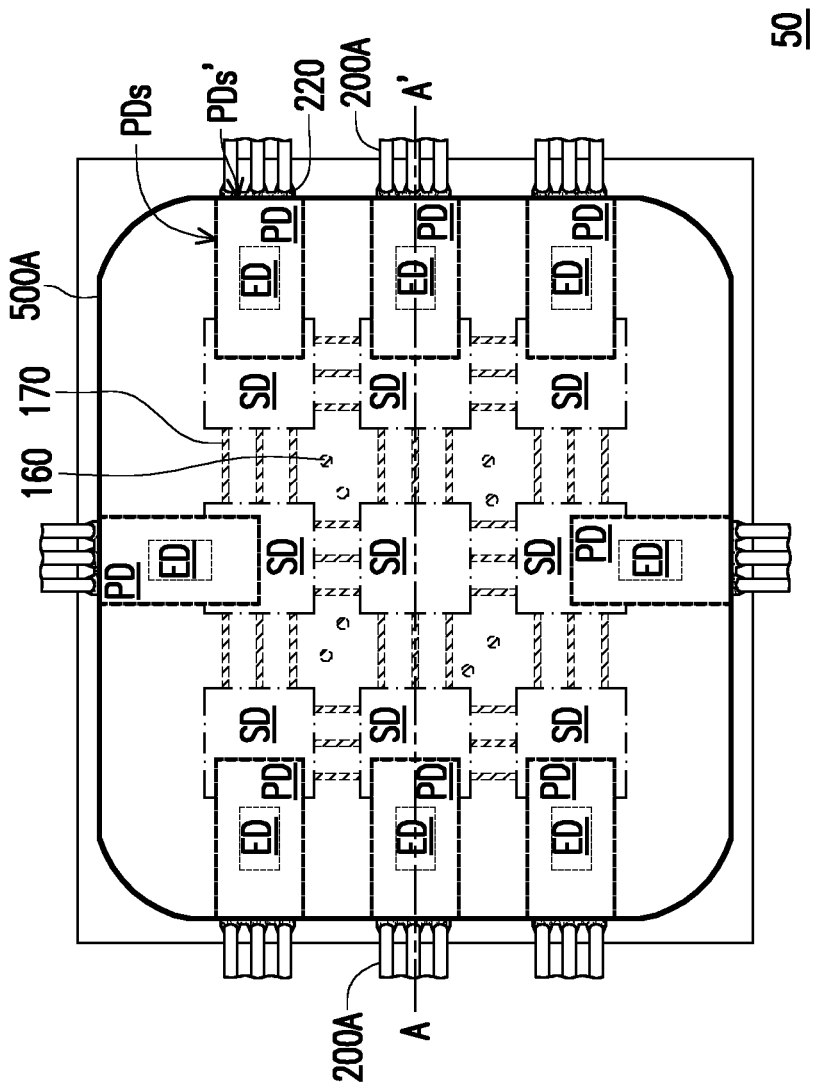
FIG. 5A is a schematic top view of a package assembly in accordance with some embodiments.
Figure 5B:
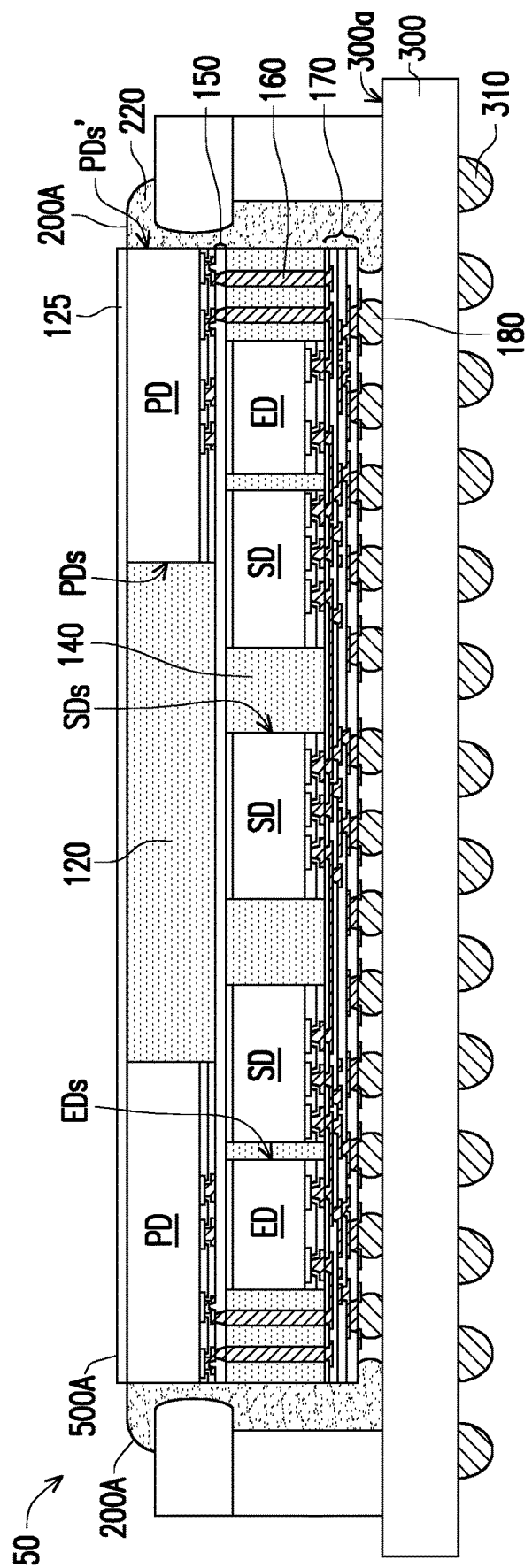
FIG. 5B is schematic cross-sectional view taken along an A-A' line illustrated in FIG. 5A in accordance with some embodiments.

FIG. 5A is a schematic top view of a package assembly in accordance with some embodiments, and FIG. 5B is schematic cross-sectional view taken along an A-A' line illustrated in FIG. 5A in accordance with some embodiments. Referring to FIGS. 5A-5B, a package assembly 50 is provided. For example, the package assembly 50 described herein may be similar to the package assembly 40 described with reference to FIGS. 4A-4B. The like or the same part will not be repeated again, and the like numeral references indicate the like elements.

In some embodiments, the package assembly 50 includes an integrated package component 500A and the optical signal ports 200A optically coupled to the integrated package component 500A. The optical signal I/O (e.g., the optical signal ports 200A) may be connected along the edges of the integrated package component 500A. In some embodiments, the integrated package component 500A and the optical signal ports 200A are disposed on the second package component 300, and the integrated package component 500A is electrically coupled to the second package component 300 through the conductive terminals 180. The optical signal ports 200A of the package assembly 50 may be partially or entirely replaced with the optical signal ports 200B described in FIGS. 3A-3C. The integrated package component 500A may be formed in a corner-truncated shape in the top view. In some embodiments, the integrated package component 500A is fabricated in a wafer form, in a package form, or the like.

In some embodiments, the integrated package component 500A includes at least one semiconductor die SD, and at least one electronic die ED disposed next to the semiconductor die SD, at least one photonic die PD stacked over the semiconductor die SD and the electronic die ED. In some embodiments, the photonic die PD is staggered with respect to the semiconductor die SD. For example, the footprint area occupied by the electronic die ED entirely overlaps the footprint area occupied by the photonic die PD in the top view. The footprint area occupied by the semiconductor die SD may partially overlap the footprint area occupied by the photonic die PD in the top view.

In some embodiments, a plurality of semiconductor dies SD are arranged in an array, and a plurality of electronic dies ED are arranged surrounding the array of the semiconductor dies SD. In some embodiments, the semiconductor dies SD are distributed over the central region of the top surface 300a of the second package component 300, and the electronic dies ED are distributed over the peripheral region of the top surface 300a of the second package component 300. In some embodiments, nine semiconductor dies SD are arranged in a 3×3 array as shown in FIG. 5A, and eight electronic dies ED surround the array of semiconductor dies SD, where the semiconductor die SD located in the middle is not adjacent to any electronic die. A plurality of photonic dies PD may be stacked over the array of semiconductor dies SD, except the semiconductor die SD located in the middle. In some embodiments, the electronic dies ED of the package assembly 50 may be partially or entirely replaced with the electronic dies ED' described in FIGS. 2B-2C. The electronic die and the photonic die of the package assembly 50 may be arranged in a face-to-back manner or a face-to-face manner which depends on the product requirements. It is appreciated that the configuration shown in FIG. 5A is merely an example, and the number, the size, and the location of the semiconductor die SD, the photonic die PD, and the electronic die ED may be modified depending on the product requirements.

In some embodiments, the integrated package component 500A includes the first insulating encapsulation 120 partially covering the photonic dies PD, the second insulating encapsulation 140 extending along the sidewalls EDs of the electronic dies ED and the sidewalls SDs of the semiconductor dies SD, the first redistribution structure 150 interposed between the first insulating encapsulation 120 and the second insulating encapsulation 140, the second redistribution structure 170 disposed on the second insulating encapsulation 140 opposite to the first redistribution structure 150, the TIVs 160 penetrating through the second insulating encapsulation 140 to be in contact with the first redistribution structure 150 and the second redistribution structure 170, and a plurality of the conductive terminals 180 disposed on the second redistribution structure 170 to be connected to the second package component 300. The integrated package component 500A optionally includes the protection layer 125 covering the photonic dies PD and the first insulating encapsulation 120. In some embodiments, the semiconductor die SD is separated from the adjacent electronic die ED by a first lateral distance, and adjacent semiconductor dies SD are separated from one another by a second lateral distance. The first lateral distance and the second lateral distance are non-zero, and the second insulating encapsulation 140 may be interposed among the adjacent semiconductor dies SD and the electronic die ED. It is noted that the first lateral distance and the second lateral distance construe no limitation in the disclosure and may be modified according to the product requirements.

The electronic die ED and the corresponding photonic die PD are electrically connected through the first redistribution structure 150, the TIVs 160, and the second redistribution structure 170. In some embodiments, the electronic dies ED and the semiconductor dies SD are electrically connected through the second redistribution structure 170. In some embodiments, the semiconductor dies SD are in electrical communication with one another through the second redistribution structure 170. In some embodiments, the conductive path for communicating among the photonic die PD, the corresponding electronic die ED, and the corresponding semiconductor die SD is arranged on the peripheral region of the second redistribution structure 170. The conductive path for communicating the semiconductor dies SD may be arranged on the central region of the second redistribution structure 170. For example, the conductive path for communicating among the photonic die PD, the corresponding electronic die ED, and the corresponding semiconductor die SD may be referred to as the external link, while the conductive path for communicating the semiconductor dies SD may be referred to as the internal link. Other routing layout of the second redistribution structure 170 may be possible. In some embodiments, the use of the second redistribution structure 170 to connect the semiconductor dies SD and the electronic dies ED minimizes the footprint area of the integrated package component 500A and also achieves high electrical performance.

Figure 6A:
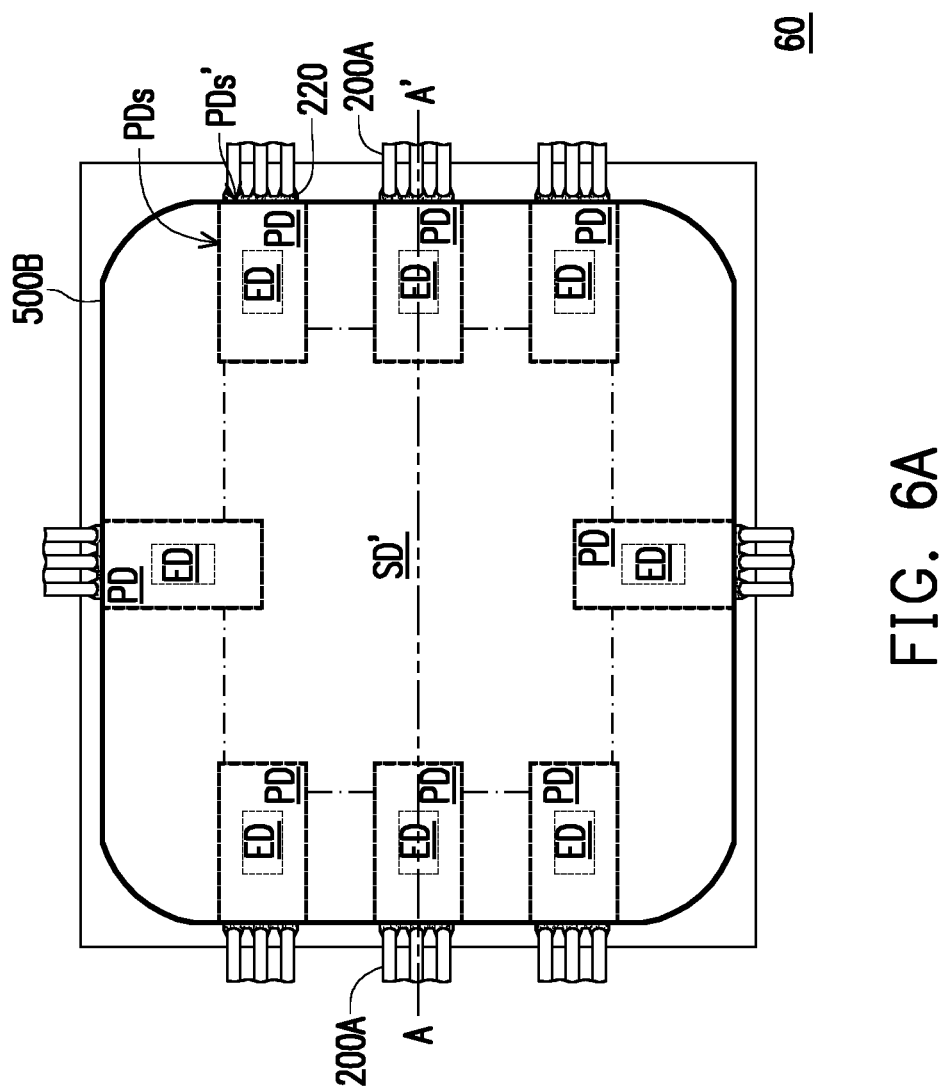
FIG. 6A is a schematic top view of a package assembly in accordance with some embodiments.
Figure 6B:
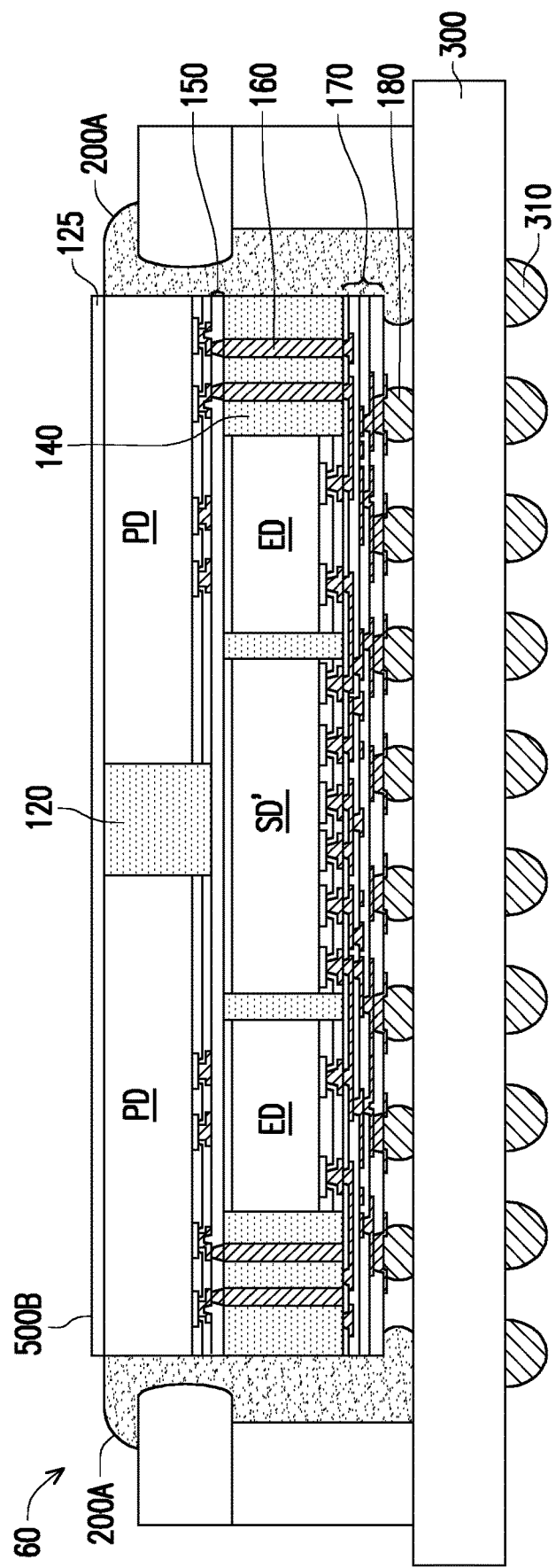
FIG. 6B is schematic cross-sectional view taken along an A-A' line illustrated in FIG. 6A in accordance with some embodiments.

FIG. 6A is a schematic top view of a package assembly in accordance with some embodiments, and FIG. 6B is schematic cross-sectional view taken along an A-A' line illustrated in FIG. 6A in accordance with some embodiments. Referring to FIGS. 6A-6B, a package assembly 60 described herein may be similar to the package assembly 50 described with reference to FIGS. 5A-5B. Only the differences therebetween will be discussed, the like or the same part will not be repeated again, and the like numeral references indicate the like elements.

For example, the difference of the package assemblies 50 and 60 lies in an integrated package component 500B. In some embodiments, the integrated package component 500B includes a single semiconductor die SD' surrounded by the electronic dies ED and laterally encapsulated by the second insulating encapsulation 140. In some embodiments, as shown in the top view of FIG. 6A, the footprint area occupied by the semiconductor die SD' partially overlaps the footprint area occupied by the respective photonic die PD, while the footprint area occupied by the respective electronic die ED fully overlaps the footprint area occupied by the photonic die PD. It is noted that other configuration is possible. In some embodiments, the integration of the electronic dies ED with the semiconductor die SD' (e.g., switch ASIC) may reduce the distance between the serializer/deserializer (SERDES) and the switch logic, which in turn may reduce the size and the power consumption of the SERDES. In some embodiments, the semiconductor die SD' may perform one or more functions including memory structures, processing structures, sensors, amplifiers, power distribution, I/O circuitry, or the like.

Figure 7A:
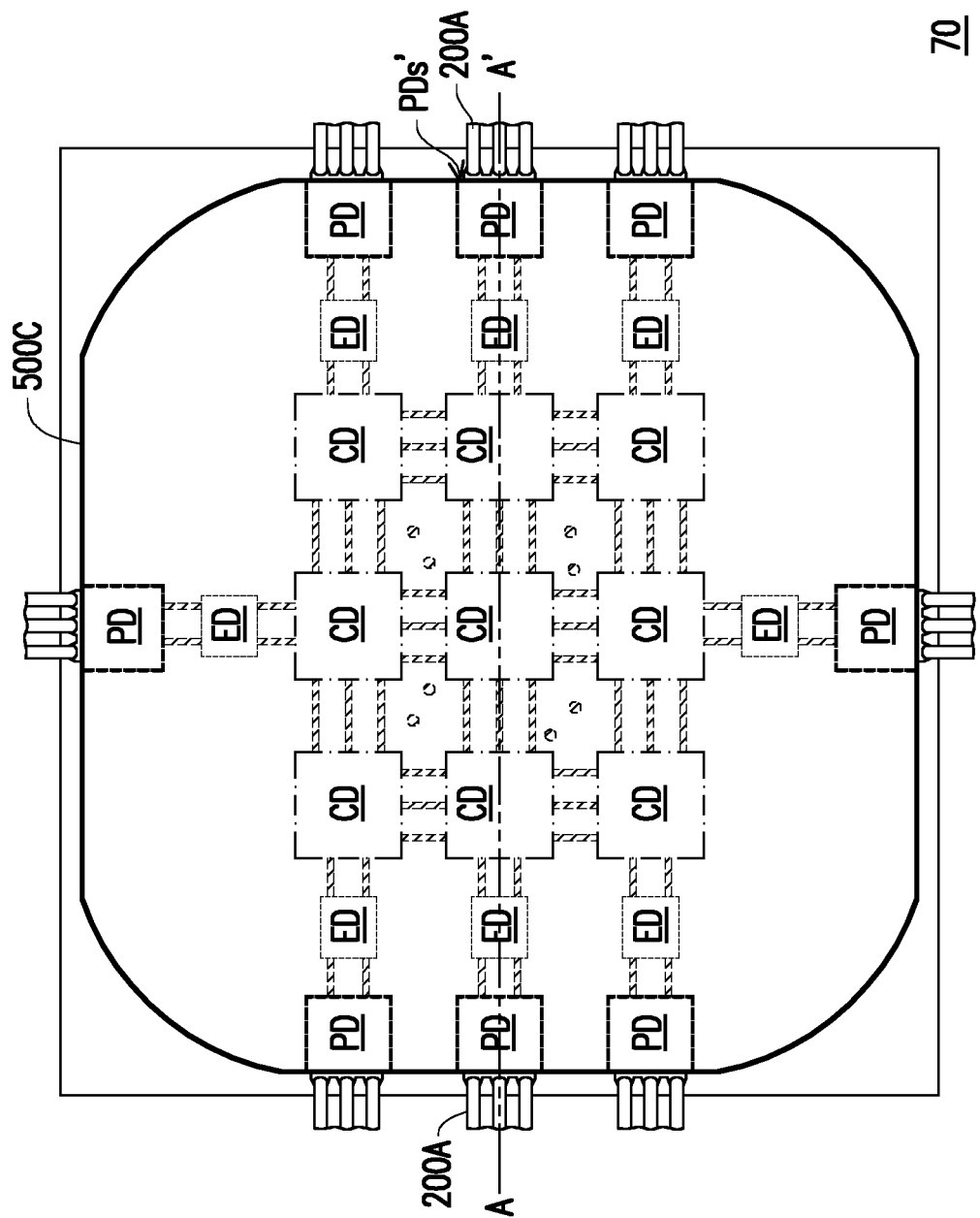
FIG. 7A is a schematic top view of a package assembly in accordance with some embodiments.
Figure 7B:
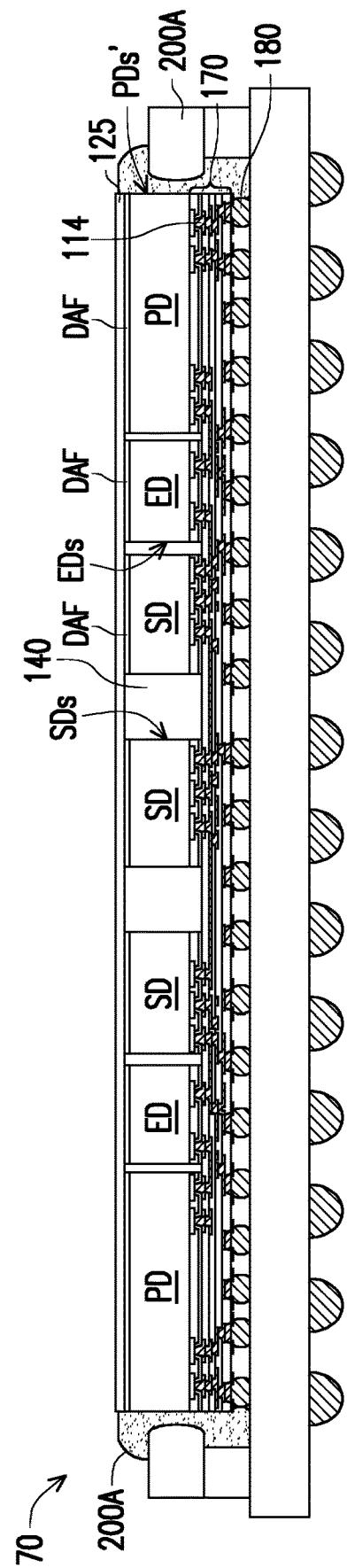
FIG. 7B is schematic cross-sectional view taken along an A-A' line illustrated in FIG. 7A in accordance with some embodiments.

FIG. 7A is a schematic top view of a package assembly in accordance with some embodiments, and FIG. 7B is schematic cross-sectional view taken along an A-A' line illustrated in FIG. 7A in accordance with some embodiments. Referring to FIGS. 7A-7B, a package assembly 70 described herein may be similar to the package assembly 40 described with reference to FIGS. 4A-4B. Only the differences therebetween will be discussed, the like or the same part will not be repeated again, and the like numeral references indicate the like elements.

For example, the package assembly 70 includes at least one semiconductor die SD, at least one electronic die ED, and at least one photonic die PD disposed side by side. By such configuration, the footprint area occupied by the semiconductor die SD, the footprint area occupied by the electronic die ED, and the footprint area occupied by the photonic die PD may not overlap one another in the top view. In some embodiments, a plurality of semiconductor dies SD are arranged in an array, a plurality of electronic dies ED are arranged to surround the array of the semiconductor dies SD, and a plurality of photonic dies PD are arranged aside the electronic dies ED opposite to the array of the semiconductor dies SD. The optical signal I/O (e.g., the optical signal ports 200A) may be optically coupled to the photonic dies PD that are arranged along the edges of the integrated package component 500C. The optical signal ports 200A of the package assembly 50 may be partially or entirely replaced with the optical signal ports 200B described in FIGS. 3A-3C.

In some embodiments, the integrated package component 500C is fabricated in a wafer form, in a package form, or the like. For example, the integrated package component 500C is formed in a corner-truncated shape in the top view. For example, the second insulating encapsulation 140 extending along the sidewalls EDs of the electronic dies ED and the sidewalls SDs of the semiconductor dies SD. The second insulating encapsulation 140 may spatially separate the respective semiconductor die SD, the respective electronic die ED, and the respective photonic die PD. In some embodiments, at least one sidewall PDs' of the respective photonic die PD is exposed by the second insulating encapsulation 140 but covers by the corresponding optical signal port 200A.

In some embodiments, the second redistribution structure 170 is connected to the photonic dies PD, the electronic dies ED, and the semiconductor dies SD. For example, the conductive path for communicating the semiconductor dies SD may be arranged on the central region of the second redistribution structure 170. The conductive path for communicating between the photonic die PD and the corresponding electronic die may be arranged on the peripheral region of the second redistribution structure 170. Other routing layout of the second redistribution structure 170 may be possible. In some embodiments, the die connectors 114 of each of the photonic dies PD are in physical and electrical contact with the second redistribution structure 170. In some embodiments, the photonic dies PD, the electronic dies ED, and the semiconductor dies SD may face down, e.g., the die connectors of each die face toward the second package component 300. In some embodiments, the second redistribution structure 170 is electrically coupled to the second package component 300 through the conductive terminals 180. The protection layer 125 is optionally disposed over the photonic dies PD, the electronic dies ED, and the semiconductor dies SD. In some embodiments, the photonic dies PD, the electronic dies ED, and the semiconductor dies SD are attached to the protection layer 125 through the die attach films DAF. Alternatively, the protection layer 125 is omitted, and the back surfaces of the photonic dies PD, the electronic dies ED, and the semiconductor dies SD may be or may not be exposed.

FIGS. 8A-8F are partially cross-sectional views of various stages of manufacturing a photonic die in accordance with some embodiments. It is appreciated that some elements of the photonic die is omitted for ease of description. The manufacturing method shown in FIGS. 8A-8F may be used to form the photonic die PD described above. In other words, the photonic die PD described in the disclosure may have the resulting structure shown in FIG. 8F. The like or the same part will not be repeated again, and the like numeral references indicate the like elements.

Referring to FIG. 8A, the substrate 111 is provided. For example, the substrate 111 is a semiconductor-on-insulator (SOI) substrate. In some embodiments, the substrate 111 includes an edge coupler 1111 formed on an insulator layer 1112. The insulator layer 1112 may be or may include a buried oxide (BOX) layer, a silicon oxide layer, or the like. In some embodiments, the insulator layer 1112 is provided on a semiconductor material layer 1113. For example, the semiconductor material includes silicon, germanium, a compound semiconductor (e.g., silicon carbide, gallium arsenic, gallium phosphide, indium phosphide, indium arsenide, etc.), an alloy semiconductor (e.g., SiGe, GaAsP, AlInAs, AlGaAs, GaInAs, GaInP, and/or GaInAsP), a combination thereof, or the like. In some embodiments, the edge coupler 1111 is made of the semiconductor material. In some embodiments, the semiconductor material layer 1113 is a silicon substrate or a glass substrate. Other substrates, such as a multi-layered or gradient substrate may also be used.

In some embodiments, a dielectric layer 1114 is formed over the insulator layer 1112 to cover the edge coupler 1111. The dielectric layer 1114 may be formed of silicon oxide, silicon nitride, a combination thereof, or the like, and may be formed by chemical vapor deposition (CVD), physical vapor deposition (PVD), atomic layer deposition (ALD), a spin-on-dielectric process, the like, or a combination thereof. In some embodiments, the dielectric layer 1114, the edge coupler 1111, and the insulator layer 1112 are located at the same level of the interconnect structure (not shown) of the photonic die PD. For example, the passivation layer 113 (shown in FIGS. 1B-1C) is formed over the dielectric layer 1114. The interconnect structure may include metal lines and vias for electrically interconnecting some devices on the semiconductor material layer 1113 and the conductive pads 112. For example, the edge coupler 1111 is formed next to the metal lines and vias of the interconnect structure. In some other embodiments, the interconnect structure (not shown) is formed over the edge coupler 1111.

Figure 8D:
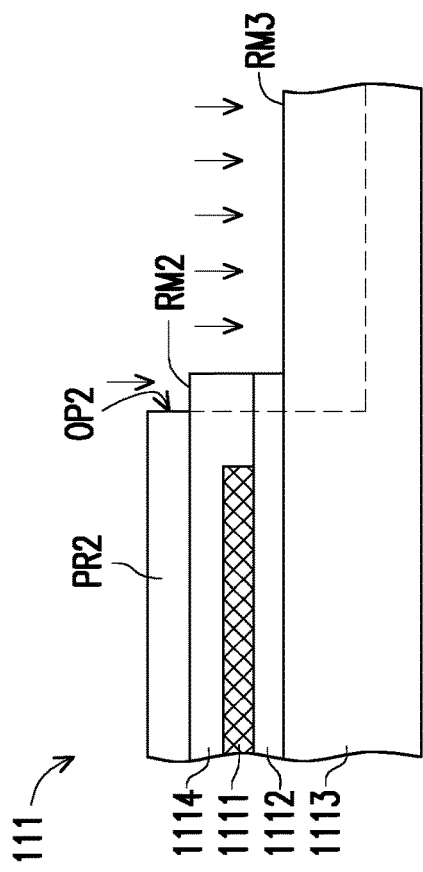
Figure 8C:
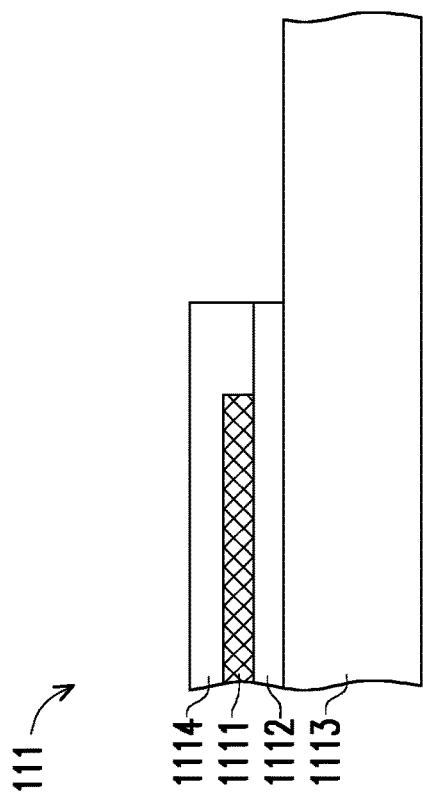

Referring to FIGS. 8B-8C, a patterned photoresist layer PR1 having an opening OP1 is formed over the dielectric layer 1114. In some embodiments, the patterned photoresist layer PR1 is formed using lithography and etching, or other suitable techniques. For example, the patterned photoresist layer PR1 is formed above the edge coupler 1111, and the opening OP1 of the patterned photoresist layer PR1 may expose a first portion RM1 of the dielectric layer 1114. Next, a first removal step is performed to remove the first portion RM1 of the dielectric layer 1114 corresponding to the opening OP1 of the patterned photoresist layer PR1. In some embodiments, a portion of the insulator layer 1112 underlying the first portion RM1 of the dielectric layer 1114 is also removed to expose the underlying semiconductor material layer 1113. For example, one or more etching processes may be performed using the patterned photoresist layer PR1 as an etching mask. The arrows illustrated in FIG. 8B may be viewed as the etching direction. In some embodiments, the patterned photoresist layer PR1 is removed from the dielectric layer 1114 after removing the first portion RM1 of the dielectric layer 1114 and the underlying insulator layer 1112. The patterned photoresist layer PR1 is removed by, for example, etching, stripping, or other suitable method.

Referring to FIGS. 8D-8E, a patterned photoresist layer PR2 having the opening OP2 is then formed over the dielectric layer 1114. For example, the patterned photoresist layer PR2 is formed above the edge coupler 1111, and a second portion RM2 of the dielectric layer 1114 and the exposed portion of the semiconductor material layer 1113 are revealed by the opening OP2 of the patterned photoresist layer PR2. Next, a second removal step is performed to remove the second portion RM2 of the dielectric layer 1114 and the exposed portion of the semiconductor material layer 1113 that are revealed by the opening OP2 of the patterned photoresist layer PR2. In some embodiments, a portion of the insulator layer 1112 and a portion of the semiconductor material layer 1113 underlying the second portion RM2 of the dielectric layer 1114 are also removed. For example, one or more etching processes may be performed using the patterned photoresist layer PR2 as an etching mask. The arrows illustrated in FIG. 8D may be viewed as the etching direction. After removing, the patterned photoresist layer PR2 is removed by such as etching, stripping, or other suitable method.

Continue to FIG. 8E, in some embodiments, after the second removal step, a recess RS is formed in the substrate 111. For example, after etching, the inner sidewalls of the dielectric layer 1114, the insulator layer 1112, and the semiconductor material layer 1113 are substantially leveled. The inner sidewalls of the dielectric layer 1114, the insulator layer 1112, and the semiconductor material layer 1113 are collectively viewed as the inner sidewall 111s of the substrate 111. For example, the recess RS is defined by the inner sidewall 111s and the exposed surface 1113s of the semiconductor material layer 1113. In some embodiments, the edge coupler 1111 is embedded in the dielectric layer 1114 and may not be revealed at the inner sidewall 111s. In some embodiments, the edge coupler 1111 is in proximity to the inner sidewall 111s for further optically coupling. In other embodiments, the edge coupler 1111 is revealed at the inner sidewall 111s.

Referring to FIG. 8F, an optical interface layer 1115 is formed in the recess RS. In some embodiments, the optical interface layer 1115 filling into the recess RS includes index matching gel, epoxy, or other suitable material. The optical interface layer 1115 may have the same or similar material to the optical interface layer 220 of the optical signal port 200A described in FIGS. 1A-1C. In some embodiments, the process steps shown in FIGS. 8A-8F are at wafer level. For example, one or more recess RS may be formed at wafer level (when the photonic die is still in the respective wafer), and before the wafer is sawed apart into the photonic dies PD. In some embodiments, a singulation process may be performed to generate a plurality of photonic dies PD after forming the optical interface layer 1115 and other processes for forming elements (e.g., the conductive pads 112, the passivation layer 113, the die connectors 114, and the protection layer 115) over the substrate 111. In some embodiments, the singulation process includes a sawing process, a laser process, an etching process, combinations thereof, or the like.

In some embodiments, the singulation process is performed along the scribe lines SL to cut through at least the optical interface layer 1115 and the underlying semiconductor material layer 1113. In some other embodiments, the optical interface layer 1115 is not cut through during the singulation process of forming the photonic die PD, but may be cut through during the subsequent packaging process for forming the aforementioned package component. The resulting photonic die PD after singulation may have at least one edge formed by coterminous outer sidewalls of the optical interface layer 1115 and the semiconductor material layer 1113. In some embodiments, a polishing process is performed on the coterminous outer sidewalls after separating the photonic dies PD from one another. In some embodiments, a polishing process is performed on the coterminous outer sidewalls before aligning the fiber 210 with the edge coupler 1111. In some embodiment in which the optical interface layer 1115 is cut through to form the edge facet of the photonic die PD, the optical interface layer 1115 provides an index-matched interface at the edge of the photonic die PD for coupling the optical interface layer 220 of the optical signal port 200A (or 200B).

Figure 9:
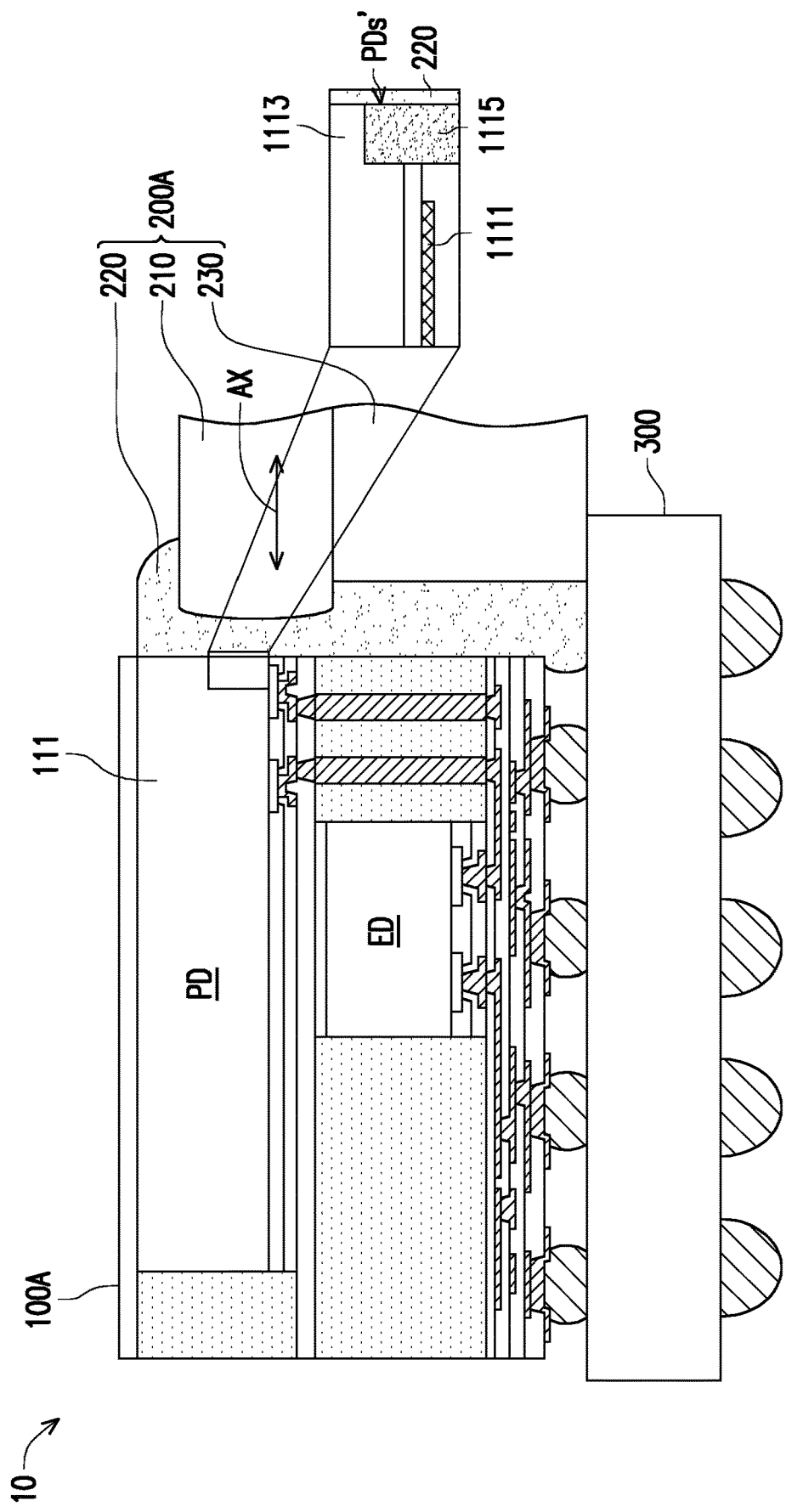
FIG. 9 is schematic cross-sectional view of a package assembly in accordance with some embodiments.

FIG. 9 is schematic cross-sectional view of a package assembly in accordance with some embodiments. It is noted that the package assembly 10 shown in FIG. 9 is the same as the package assembly 10 described in FIGS. 1A-1C, and the details of the edge coupler in the photonic die PD is illustrated in the enlarged view. The like or the same part will not be repeated again, and the like numeral references indicate the like elements.

Referring to FIG. 9, the photonic die PD of the package assembly 10 may be fabricated using the method described in FIGS. 8A-8F to have the edge coupler 1111 formed therein. In some embodiments, the edge coupler 1111 embedded in the dielectric layer 1114 is in proximity to the sidewall PDs' of the photonic die PD. Although only one edge coupler 1111 is illustrated, the photonic die PD may include a plurality of edge couplers 1111 therein for dense optical coupling. For example, the sidewall PDs' of the photonic die PD includes the coterminous outer sidewall of the optical interface layer 1115 and the semiconductor material layer 1113. The optical interface layer 220 of the optical signal port 200A may be in physical contact with the sidewall PDs' of the photonic die PD including the coterminous outer sidewall of the optical interface layer 1115 and the semiconductor material layer 1113. A portion of the sidewall PDs' of the photonic die PD corresponding to the edge coupler 1111 may be viewed as the edge facet of the photonic die PD. In some embodiments, the laterally extending direction of the edge coupler 1111 may be parallel to the fiber axis AX. For example, the fibers 210 of the optical signal port 200A are arranged horizontally and aligned with the edge coupler 1111. In some embodiments in which the fiber 210 is a lensed fiber, a tip portion (not shown) of the lensed fiber may face the sidewall PDs' of the photonic die PD and may be aligned with the edge coupler 1111 for optical connection. It is noted that the illustrate of the package assembly in FIG. 9 is an example, different variations of the package assembly discussed in the disclosure may include the edge coupler 1111 in the photonic die for optical coupling.

FIGS. 10A-10I are schematic cross-sectional views of various stages of manufacturing a package assembly in accordance with some embodiments. For example, the manufacturing method shown in FIGS. 10A-10I is the method for forming the package assembly 60 described in FIGS. 6A-6B. The materials may be found in the discussion of the embodiments above, and hence are not repeated herein. In addition, the like or the same part will not be repeated again, and the like numeral references indicate the like elements.

Figure 10A:
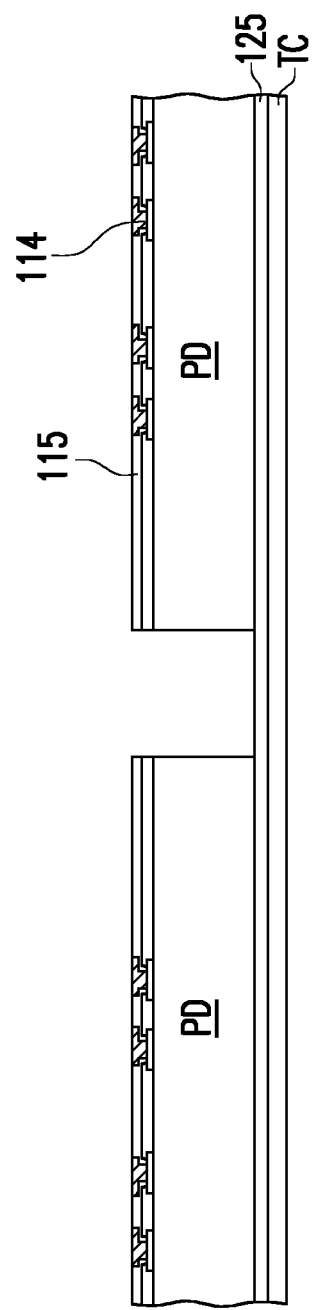
FIGS. 10A-10I are schematic cross-sectional views of various stages of manufacturing a package assembly in accordance with some embodiments.

Referring to FIG. 10A, a plurality of photonic dies PD is disposed over a temporary carrier TC. The temporary carrier TC may be a glass carrier, a ceramic carrier, or the like. In some embodiments, the protection layer 125 is formed over the temporary carrier TC, and then the bottom surface 111b of the photonic dies PD are attached to the protection layer 125 by, e.g., a pick-and-place process or other suitable method. In some embodiments, a release film (not shown) is interposed between the temporary carrier TC and the protection layer 125. For example, the release film is formed of a polymer-based material (e.g., a light-to-heat-conversion (LTHC) material), which may be removed together with temporary carrier TC from the overlying structures that will be formed in subsequent steps.

Figure 10B:
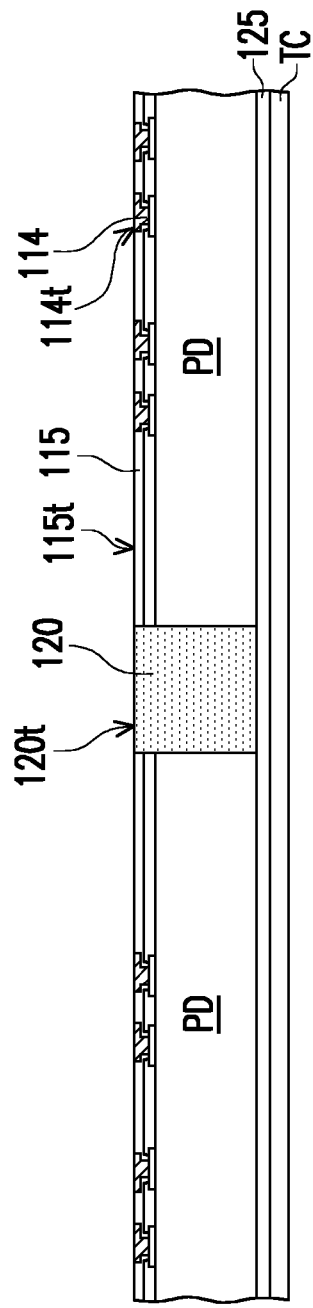

Referring to FIG. 10B, the first insulating encapsulation 120 is formed on the protection layer 125 to laterally cover the photonic dies PD. For example, the photonic dies PD are over-molded by an insulating material (not shown) using suitable molding process, and then the insulating material is thinned until at least a portion of the die connectors 114 of each photonic die PD is accessibly revealed. For example, the insulating material is thinned by chemical mechanical polishing (CMP), mechanical grinding, or the like. In some embodiments, after the first insulating encapsulation 120 is formed, the top surface 120t of the first insulating encapsulation 120 is substantially leveled with the top surfaces of the photonic dies PD. For example, the top surface of the respective photonic die PD includes the top surfaces 114t of the die connectors 114 and the top surface 115t of the protection layer 115.

Figure 10C:
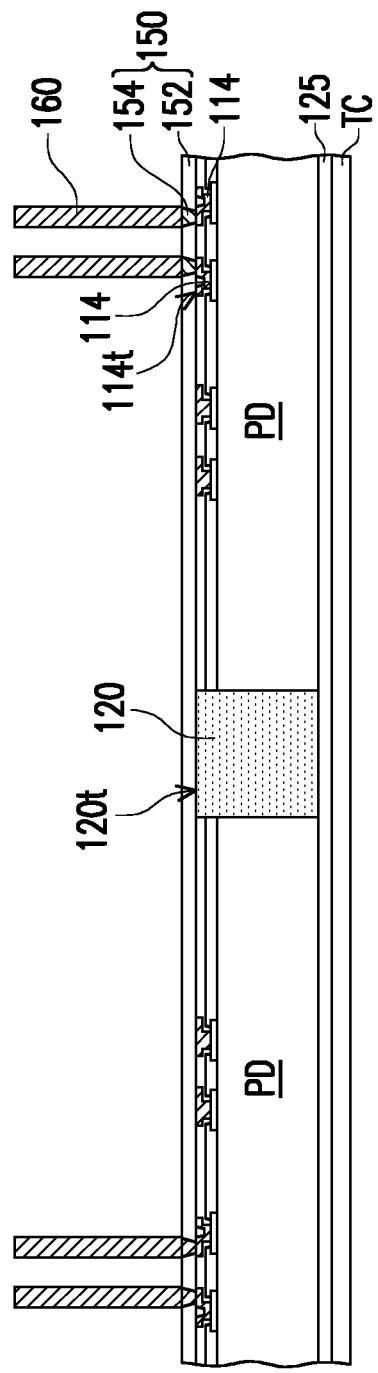

Referring to FIG. 10C, the first redistribution structure 150 is formed on the first insulating encapsulation 120 and the photonic dies PD. For example, the first patterned dielectric layer 152 is formed on the top surface 120t of the first insulating encapsulation 120 and the top surfaces of the photonic dies PD, and the openings (not labeled) of the first patterned dielectric layer 152 may accessibly expose at least a portion of the die connectors 114 of each photonic die PD. In some embodiments, the first patterned dielectric layer 152 is formed by deposition, lithography, etching, and/or other suitable process. Next, the first patterned conductive layer 154 is formed in the openings of the first patterned dielectric layer 152 to be in physical and electrical contact with the die connectors 114 of each photonic die PD. For example, the first patterned conductive layer 154 is formed by depositing a seed layer into the openings, carrying out plating a conductive material on the seed layer, and then planarizing the conductive material to remove excess conductive material from the first patterned conductive layer 154. Other suitable processes may be used to form the first patterned conductive layer 154. It should be noted that only one layer of the first patterned dielectric layer 152 and only one layer of the first patterned conductive layer 154 illustrated herein is merely an example, the first redistribution structure 150 may be a multi-layer structure in accordance with some embodiments. The number of the first patterned dielectric layer 152 and the first patterned conductive layer 154 may change depending on the circuit design, and the number of these layers may construe no limitation in the disclosure.

Subsequently, the TIVs 160 are formed on the first redistribution structure 150. For example, the TIVs 160 are in physical and electrical contact with the first patterned conductive layer 154. In some embodiments, the TIVs 160 are formed during the same process of forming the first patterned conductive layer 154. In other embodiments, the TIVs 160 are pre-formed and may be disposed on the first patterned conductive layer 154.

Figure 10D:
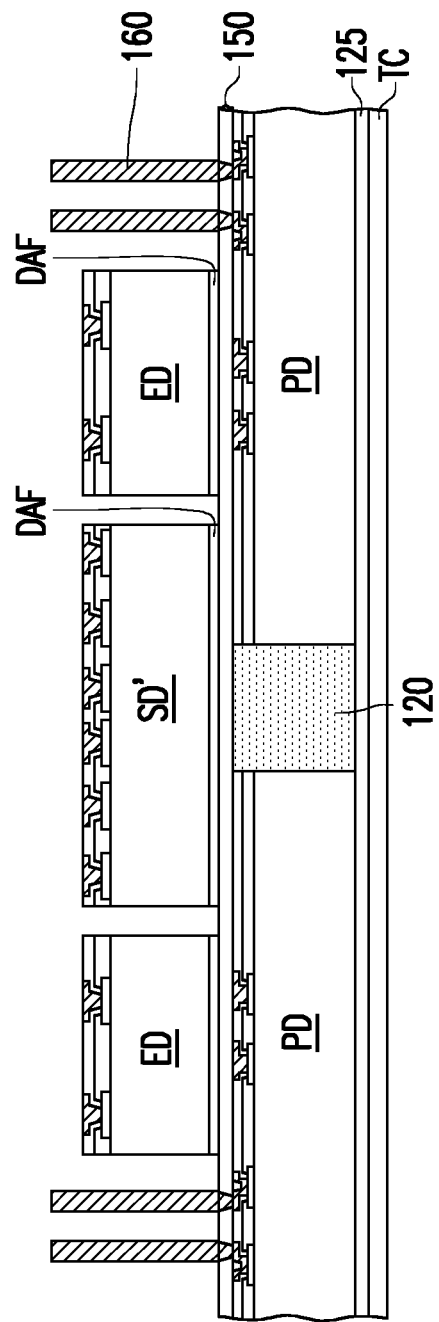

Referring to FIG. 10D, a plurality of electronic dies ED and the semiconductor die SD' are disposed on the first redistribution structure 150 by, e.g., a pick-and-place process or other suitable methods. In some embodiments, the electronic dies ED and/or the semiconductor die SD' may be attached to the first patterned dielectric layer 152 through the die attach film(s) DAF. In some embodiments, the semiconductor die SD' may be replaced with the semiconductor die SD described in FIGS. 5A-5B. In some embodiments, the semiconductor die SD' is replaced with additional electronic die ED.

Figure 10E:
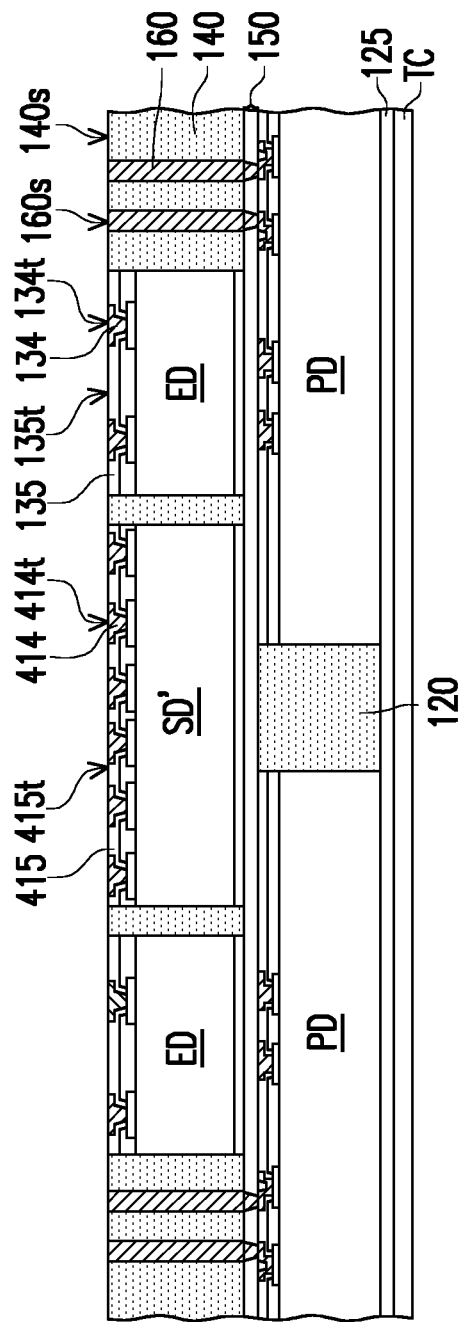

Referring to FIG. 10E, the second insulating encapsulation 140 is formed on the first redistribution structure 150 to laterally cover the TIVs 160, the electronic dies ED, and the semiconductor die SD'. The forming process of the second insulating encapsulation 140 may be similar to that of the first insulating encapsulation 120, and the detailed descriptions are omitted for the sake of brevity. In some embodiments, the top surface 140s of the second insulating encapsulation 140 and the top surfaces 160s of the TIVs 160 are substantially leveled with the top surfaces of the electronic dies ED and the top surface of the semiconductor die SD'. For example, the top surface of the respective electronic die ED includes the top surfaces 134t of the die connectors 134 and the top surface 135t of the protection layer 135. The top surface of the semiconductor die SD' may include the top surfaces 414t of the die connectors 414 and the top surface 415t of the protection layer 415.

Figure 10F:
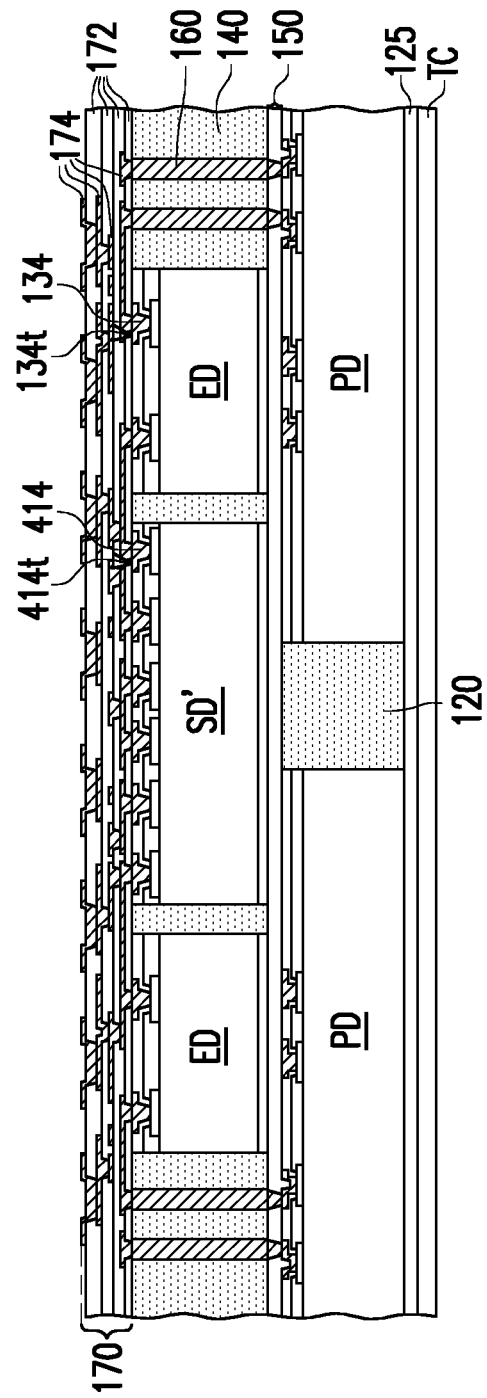

Referring to FIG. 10F and also with reference to FIG. 1E, the second redistribution structure 170 is formed on the second insulating encapsulation 140, the TIVs 160, the electronic dies ED, and the semiconductor die SD'. For example, the second redistribution structure 170 is a multi-layer structure including a plurality of second patterned dielectric layers 172 and a plurality of second patterned conductive layers 174 alternately stacked. In some embodiments, the bottommost one of the second patterned dielectric layers 172 is formed on the top surface 140s of the second insulating encapsulation 140 and extends to partially cover the top surfaces 160s of the TIVs 160, the top surfaces of the electronic dies ED, and the top surfaces of the semiconductor die SD'. For example, the openings of the bottommost one of the second patterned dielectric layers 172 may accessibly reveal the TIVs 160, the die connectors 134 of the electronic dies ED, and the die connectors 414 of the semiconductor die SD'. Next, the bottommost one of the second patterned conductive layers 174 is formed in the openings of the bottommost one of the second patterned dielectric layers 172 and on the top surface of the openings of the bottommost one of the second patterned dielectric layers 172 using suitable patterning and metallization techniques. The portions of the bottommost one of the second patterned conductive layers 174 formed in the openings of the bottommost one of the second patterned dielectric layers 172 may be in physical and electrical contact with the TIVs 160, the die connectors 134 of the electronic dies ED, and the die connectors 414 of the semiconductor die SD'.

The aforementioned steps may be performed several times to form a multi-layer structure. In some embodiments, the topmost one of the second patterned conductive layer 174 may include UBM patterns for further electrical connection. It should be noted that the number of the second patterned dielectric layers 172 and the number of the second patterned conductive layers 174 may depend on the circuit design and may construe no limitation in the disclosure.

Figure 10G:
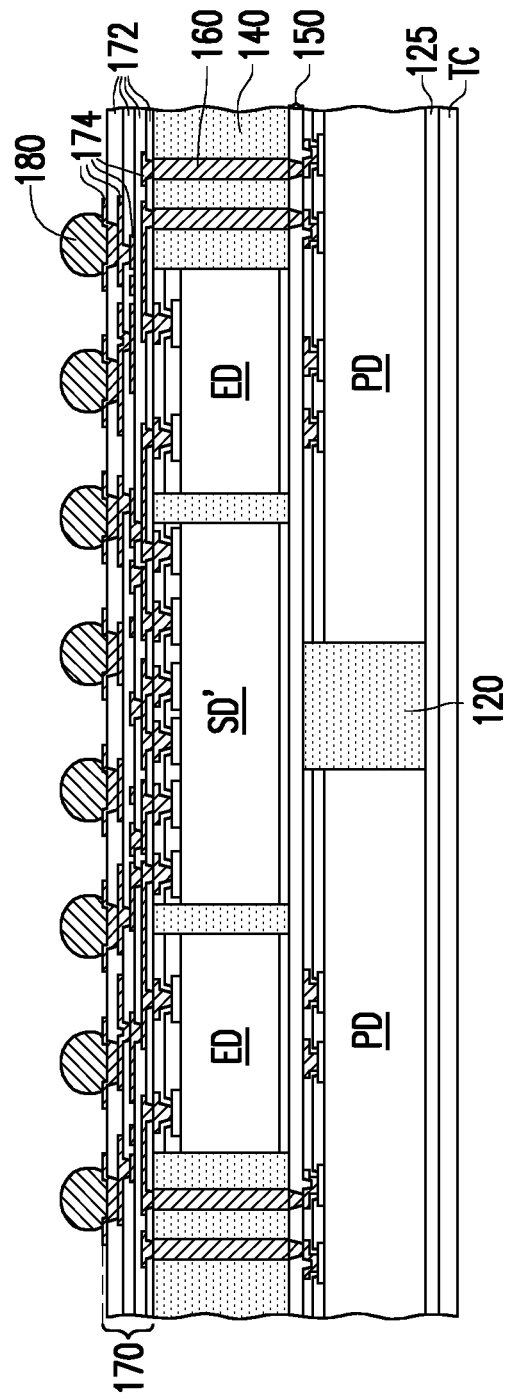

Referring to FIG. 10G, the conductive terminals 180 are formed on the topmost one of the second patterned conductive layers 174. For example, the conductive terminals 180 are formed by initially forming a layer of solder through, e.g., ball placement, evaporation, plating, printing, solder transfer, or the like. A reflow process may be performed on the layer of solder to reshape the material into the desired bump shapes. In some other embodiments, the conductive terminals 180 are metal pillars formed by sputtering, printing, plating, or the like. In some embodiments, after forming the conductive terminals 180, the temporary carrier TC is removed from the protection layer 125. In some embodiments in which the release film is interposed between the temporary carrier TC and the protection layer 125, the temporary carrier TC is removed by projecting a UV light or a laser beam on the release film, so that release film decomposes under the heat of the UV light or the laser beam. Other removal techniques (e.g., etching, grinding, a combination thereof, etc.) may be used to remove the temporary carrier TC. In some other embodiments, the protection layer 125 is removed together with the temporary carrier TC in a cleaning process or a backside grinding process.

In some embodiments, after forming the conductive terminals 180, a singulation process is performed along the scribe lines (not shown) to form the integrated package components 500B. In some embodiments, the second redistribution structure 170, the second insulating encapsulation 140, the first redistribution structure 150, the photonic die PD, and the protection layer 125 may be cut through during the singulation process. The resulting structure after singulation may have at least one edge formed by coterminous outer sidewalls of the second redistribution structure 170, the second insulating encapsulation 140, the first redistribution structure 150, the photonic die PD, and the protection layer 125. For example, after the singulation process, the sidewalls PDs' of the photonic die PD is accessibly revealed for optical coupling. In some embodiments, a polishing process is performed on the sidewalls PDs' of the photonic die PD to render a smooth edge facet for optical coupling. For example, since a surface roughness of the sidewalls PDs' of the photonic die PD corresponding to the optical interface layer 1115 (shown in FIGS. 8A-9) is reduced during the polishing process, the Fresnel loss may be decreased and a better optical coupling may be achieved.

Figure 10H:
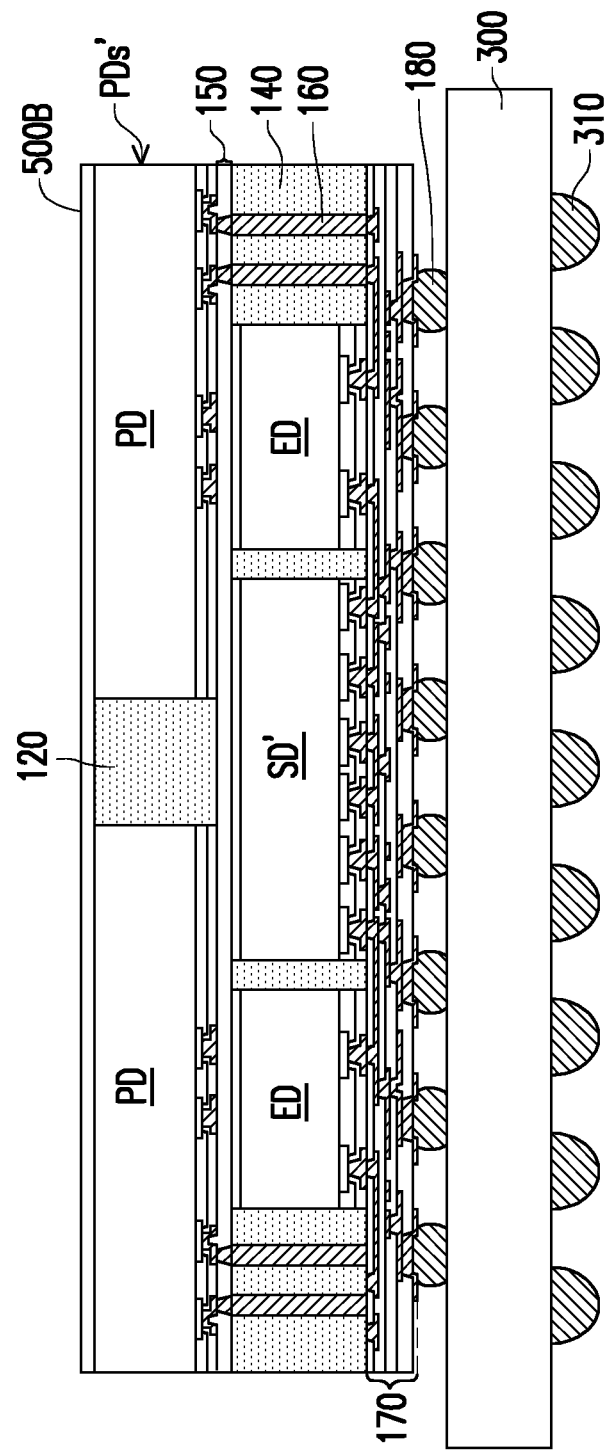
Figure 10I:
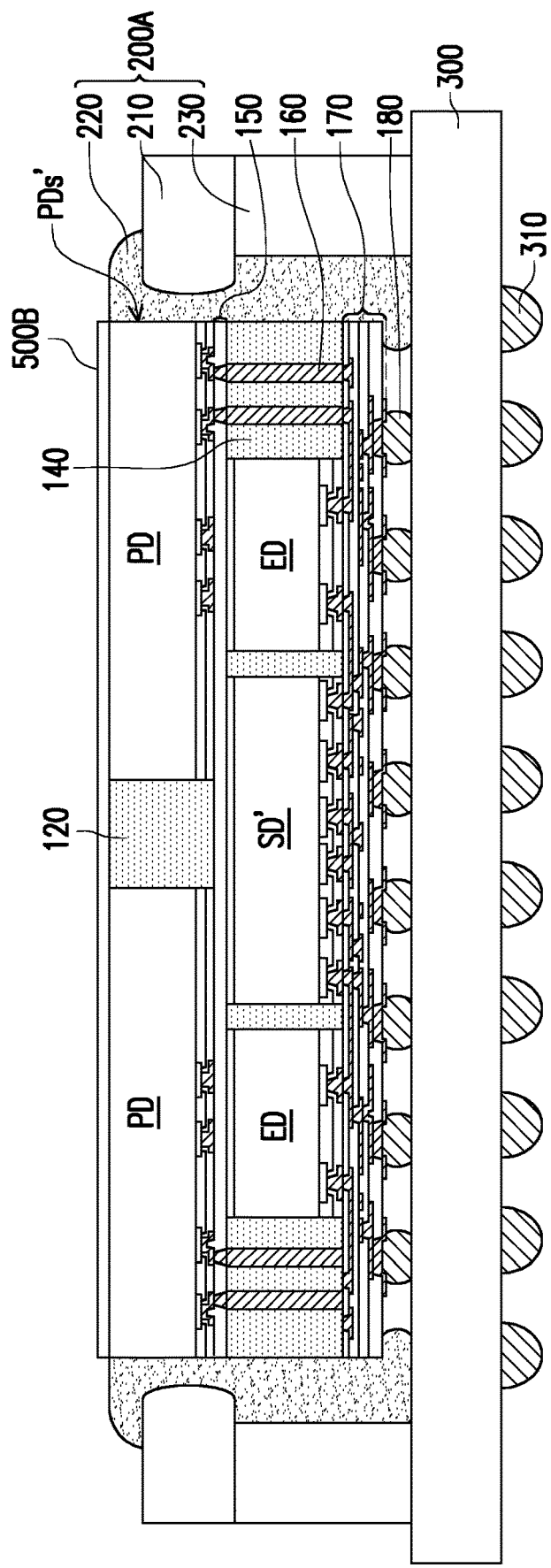

Referring to FIGS. 10H-10I, the integrated package component 500B is then mounted on the second package component 300. In some embodiments, a reflow process is performed to bond the conductive terminals 180 of the integrated package component 500B to the second package component 300. Other suitable mounting techniques may be used. Subsequently, the optical signal port 200A is bonded to the integrated package component 500B and the second package component 300. For example, when mounting the optical signal port 200A, the coupling between the fiber 210 and the integrated package component 500B is optimized by aligning the fiber 210 with the edge coupler (not shown) in the photonic die PD. In some embodiments, when optimized coupling connection between the fiber 210 and the photonic die PD is reached, an optical adhesive material is dispensed therebetween and then cured to form the optical interface layer 220. Other suitable aligning and bonding techniques may be used to couple the optical signal port 200A. In some embodiments, the optical signal port 200A is replaced with the optical signal port 200B. For example, a sufficient amount of the optical adhesive material is dispensed to cover the gap between the fiber 210 and the sidewall of the integrated package component 500B and further extended to fill the gap between the integrated package component 500B and the second package component 300.

It is noted that the aforementioned steps may be used to form the first package component including the photonic die PD and the electronic die ED arranged in a face-to-back manner described above, such as the first package component 100A described in FIGS. 1A-1C. It is also noted that the aforementioned steps may be used to form the integrated package component 500A described in FIGS. 5A-5B, where the single semiconductor die SD' is replaced with the plurality of semiconductor dies SD. Variations thereof may be carried out while still remaining within the scope of the claims and disclosure.

FIGS. 11A-11I are schematic cross-sectional views of various stages of manufacturing a package assembly in accordance with some embodiments. For example, the manufacturing method shown in FIGS. 11A-11I is the method for forming the package assembly 20 described in FIGS. 2A-2C. The process steps and the materials may be found in the discussion of the embodiments above, and hence are not repeated herein. In addition, the like or the same part will not be repeated again, and the like numeral references indicate the like elements.

Figure 11A:
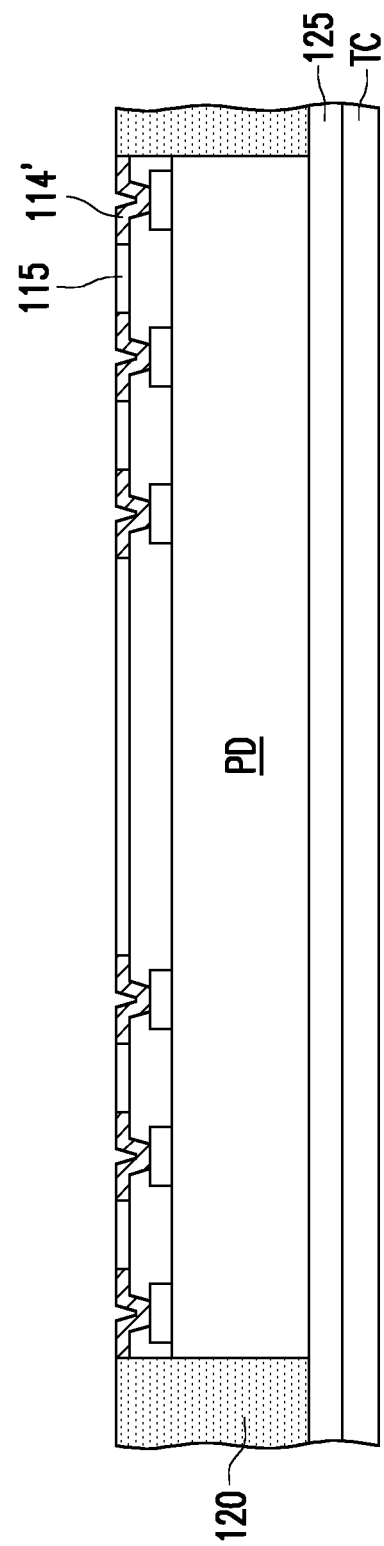
FIGS. 11A-11I are schematic cross-sectional views of various stages of manufacturing a package assembly in accordance with some embodiments.

Referring to FIG. 11A, the photonic die PD is disposed over the temporary carrier TC. In some embodiments, the protection layer 125 is formed over the temporary carrier TC, and then the bottom surface 111b of photonic dies PD are attached to the protection layer 125. In some embodiments, the first insulating encapsulation 120 is formed on the protection layer 125 to laterally cover the photonic dies PD. The step shown in FIG. 11A may be similar to the step described in FIGS. 10A-10B, so the detailed descriptions are omitted for the sake of brevity.

Figure 11B:
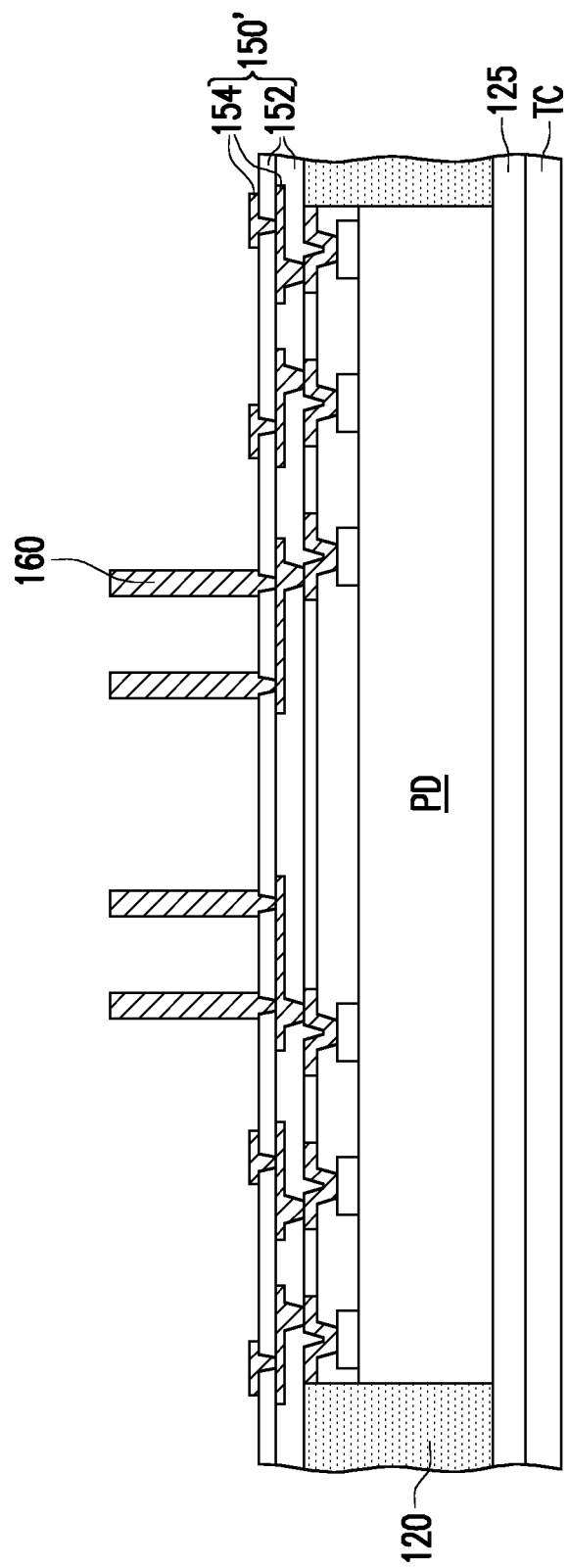

Referring to FIG. 11B, the first redistribution structure 150' is formed on the photonic die PD. For example, the first redistribution structure 150' is a multi-layer structure including a plurality of first patterned dielectric layers 152 and a plurality of first patterned conductive layers 154 alternately stacked. In some embodiments, the bottommost one of the first patterned dielectric layers 152 is formed on the photonic die PD, where at least a portion of the die connectors 114' is accessibly revealed by the openings of the bottommost one of the first patterned dielectric layers 152. Next, the bottommost one of the first patterned conductive layers 154 is formed in the openings of the bottommost one of the first patterned dielectric layers 152 and also formed on the top surface of the bottommost one of the first patterned dielectric layers 152, where the portions of the bottommost one of the first patterned conductive layers 154 formed in the openings may be in physical and electrical contact with the die connectors 114' of the photonic die PD.

The aforementioned steps may be performed several times to form a multi-layer structure. It should be noted that the number of the first patterned dielectric layers 152 and the number of the first patterned conductive layers 154 may depend on the circuit design and may construe no limitation in the disclosure. In some embodiments, a portion of the topmost one of the first patterned conductive layers 154 is protruded from the topmost one of the first patterned dielectric layers 152 for further electrical connection. In some embodiments, after forming the first redistribution structure 150', the TIVs are formed on the topmost one of the first patterned conductive layers 154 of the first redistribution structure 150'.

Figure 11C:
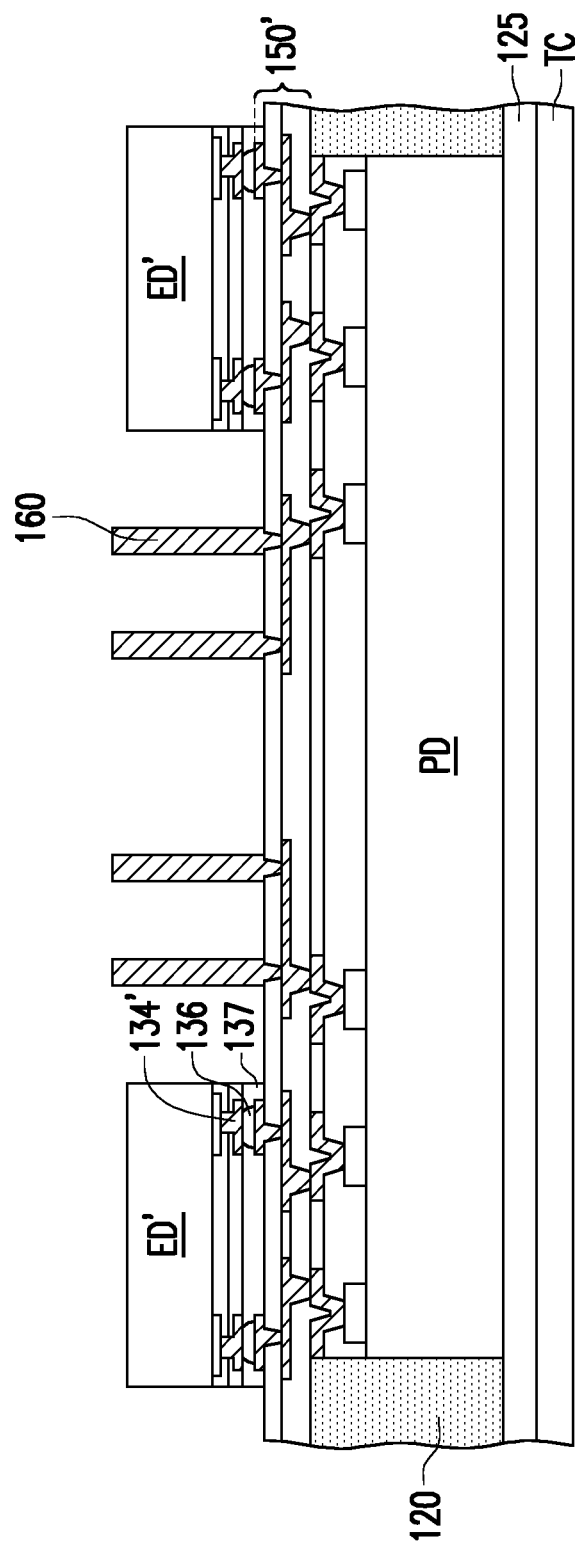

Referring to FIG. 11C, the electronic dies ED' are mounted on the first patterned conductive layers 154 of the first redistribution structure 150'. In some embodiments, flip-chip packaging techniques may be employed such that the electronic dies ED' and the photonic die are communicatively coupled to one another through the first redistribution structure 150'. In some embodiments, the die connectors 134' of the respective electronic die ED' are connected to the topmost one of the first patterned conductive layers 154 through a plurality of conductive joints 136. In some embodiments, the underfill layer 137 may be formed between the gap of the respective electronic die ED' and the first redistribution structure 150' to laterally cover the conductive joints 136.

Figure 11D:
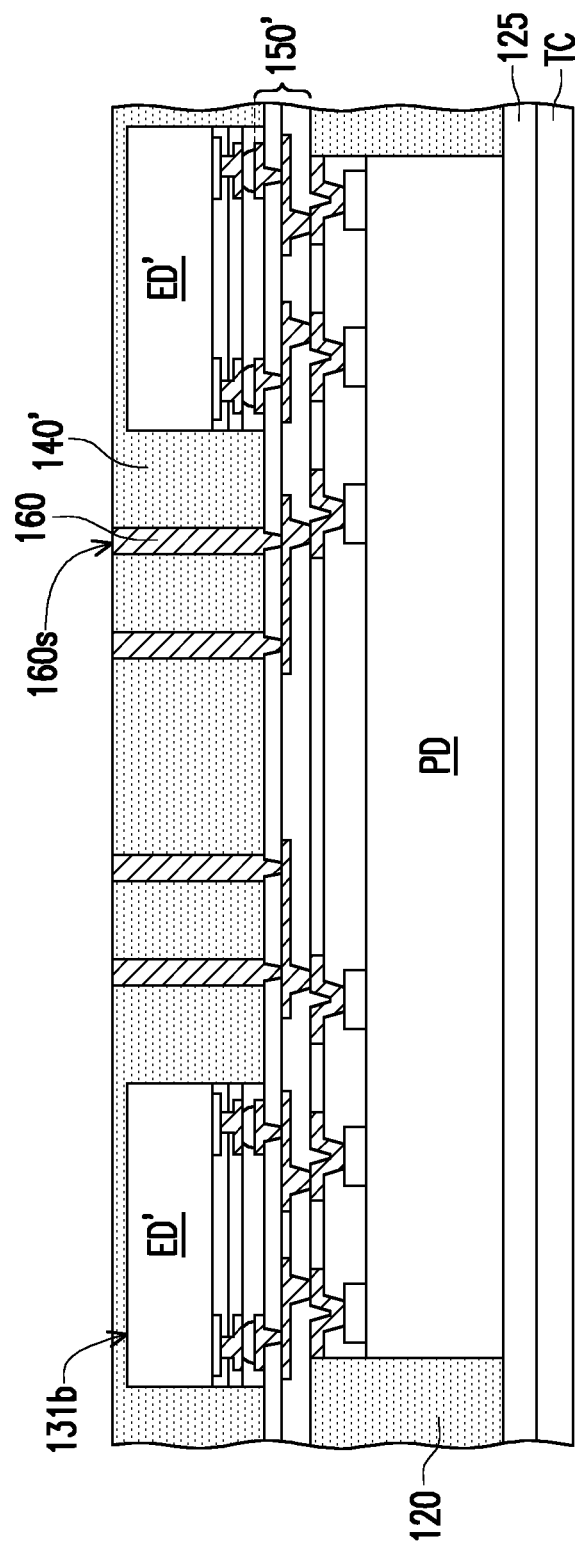

Referring to FIG. 11D, the second insulating encapsulation 140' is formed on the first redistribution structure 150' to cover the electronic dies ED' and the TIVs 160. The forming process of the second insulating encapsulation 140' may be similar to that of the second insulating encapsulation 140 described in FIG. 10E. In some embodiments, the electronic dies ED' are over-molded by the second insulating encapsulation 140' while at least a portion of the top surfaces 160s of the TIVs 160 is accessibly revealed by the second insulating encapsulation 140 for further electrical connection. In some other embodiments, the insulating material may be thinned to expose the bottom surfaces 131b of the electronic dies ED and the top surfaces 160s of the TIVs 160.

Figure 11E:
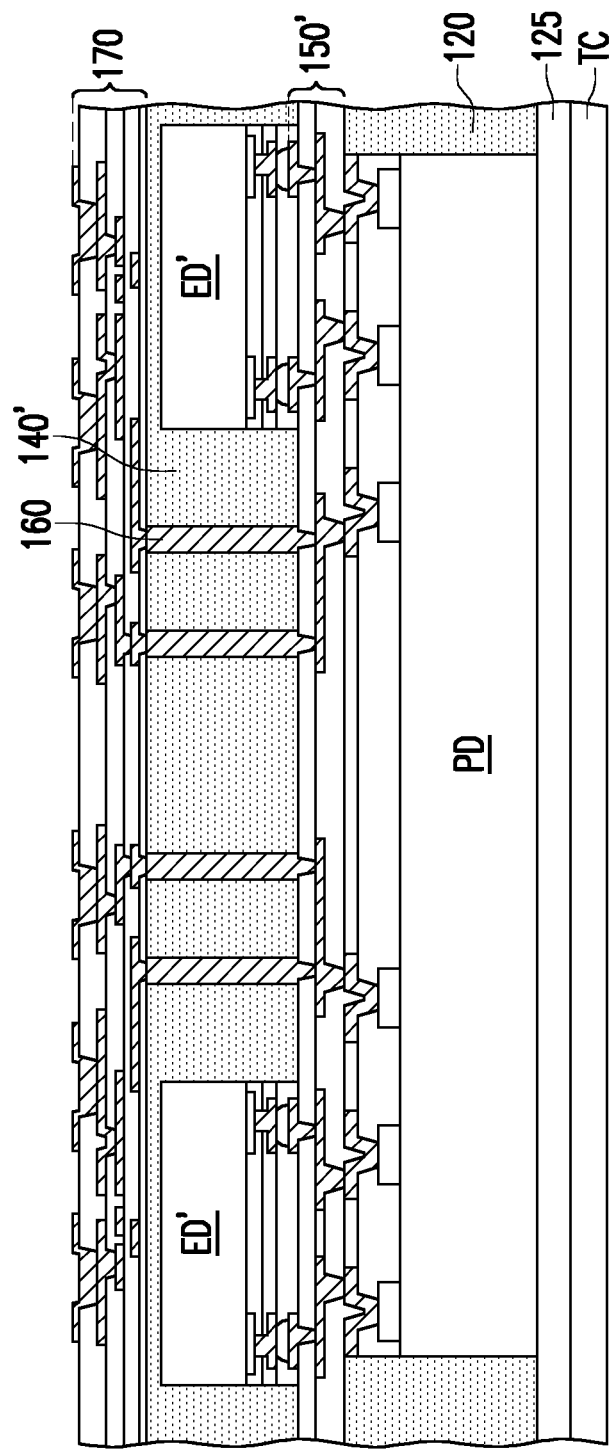
Figure 11F:
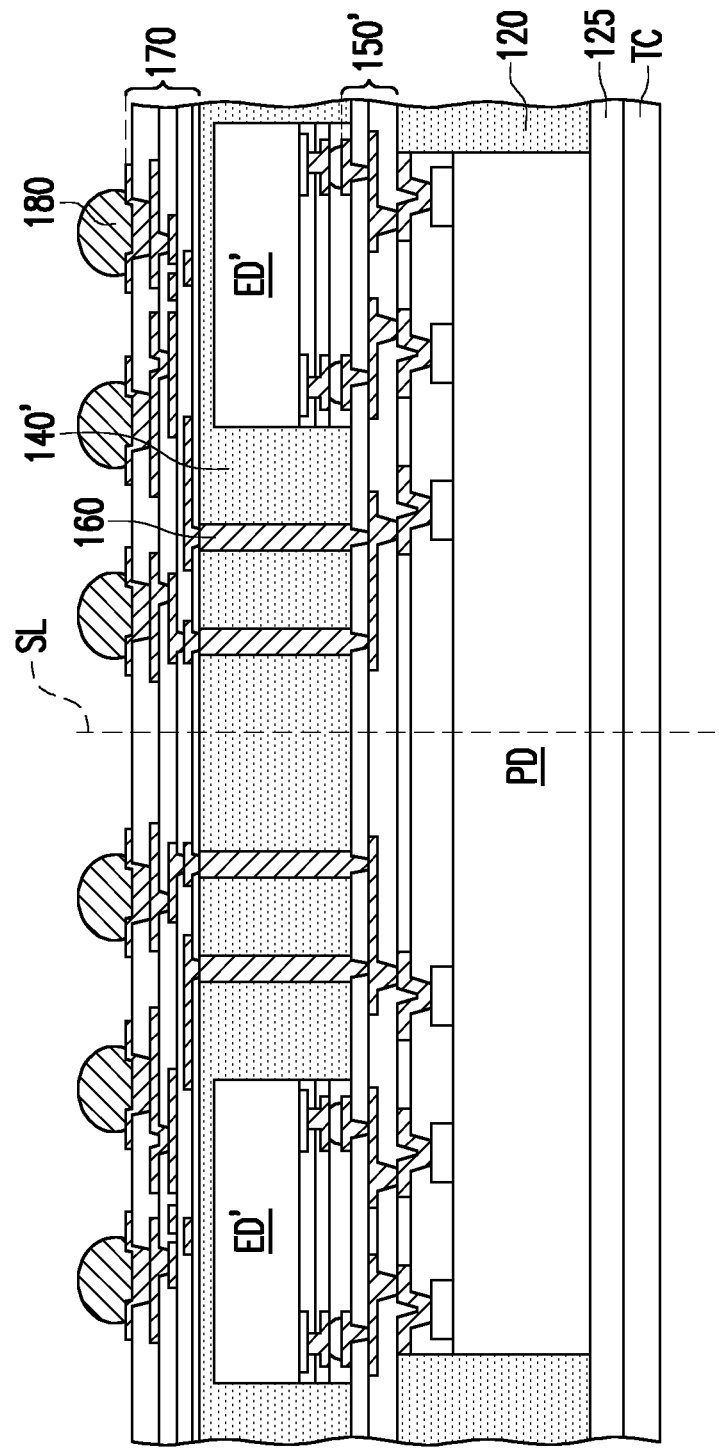

Referring to FIGS. 11E-11F, the second redistribution structure 170 is formed on the TIVs 160 and the second insulating encapsulation 140'. The second redistribution structure 170 may be electrically coupled to the electronic dies ED through the TIVs 160 and the first redistribution structure 150'. The conductive terminals 180 are subsequently formed on the second redistribution structure 170. In some embodiments, after forming the conductive terminals 180, the temporary carrier TC is de-bonded to reveal the protection layer 125. The forming processes of the second redistribution structure 170 and the conductive terminals 180 and the de-bonding process may be similar to the processes described in FIGS. 10F-10G, so the detailed descriptions are omitted for the sake of brevity.

Figure 11G:
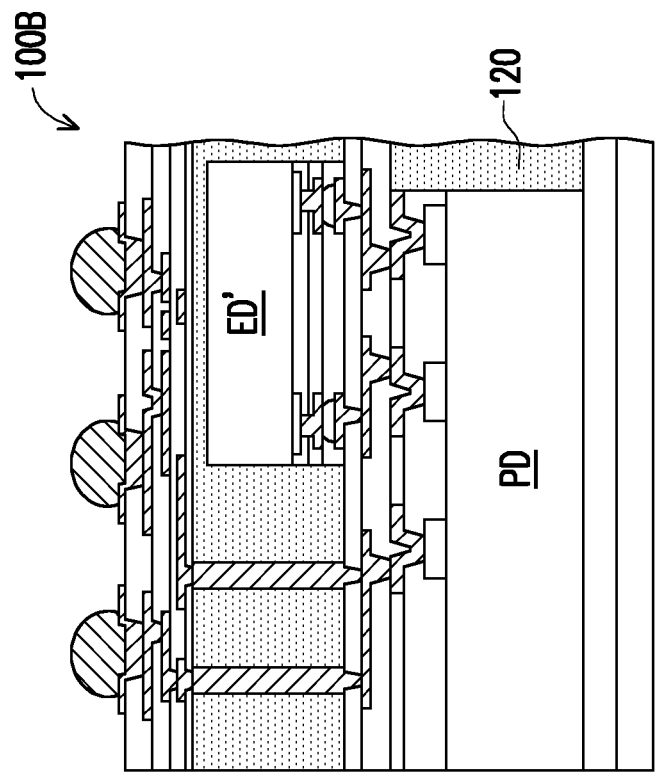
Figure 11G:
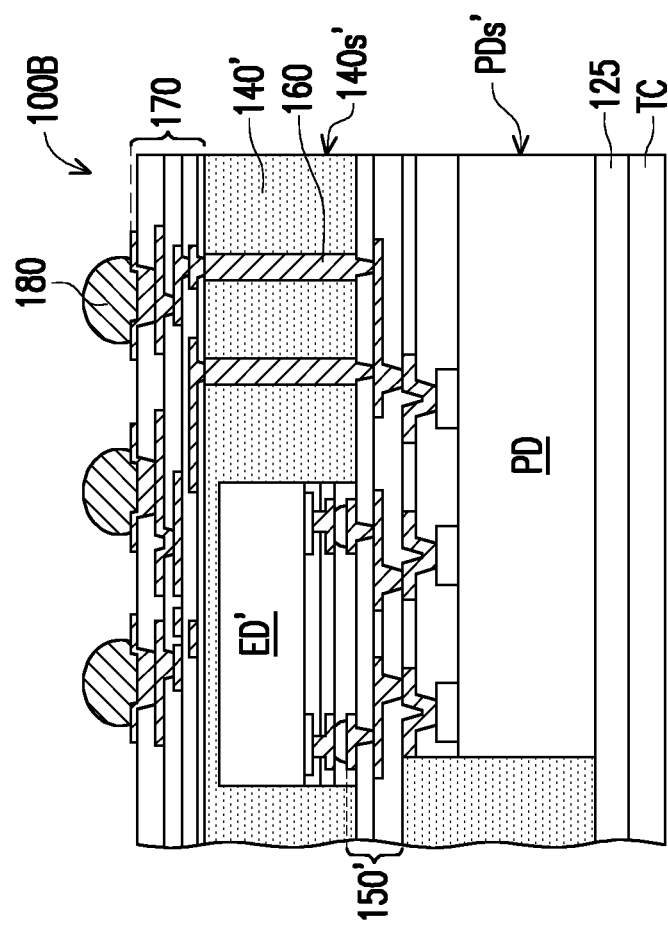

Referring to FIG. 11G, a singulation process is performed along the scribe lines SL shown in FIG. 11G to form a plurality of first package components 100B. In some embodiments, a dicing tool (not shown) may cut off the second redistribution structure 170, the second insulating encapsulation 140', the first redistribution structure 150', the photonic die PD, and the protection layer 125 during the singulation process. The resulting structure after singulation may have at least one edge formed by coterminous outer sidewalls of the second redistribution structure 170, the second insulating encapsulation 140', the first redistribution structure 150', the photonic die PD, and the protection layer 125. For example, after the singulation process, the sidewalls PDs' of the photonic die PD is accessibly revealed for coupling. In some embodiments, a polishing process is performed on the sidewalls PDs' of the photonic die PD to provide a better optical coupling. In other words, the sidewalls PDs' of the photonic die PD is substantially leveled with a sidewall 140s' of the second insulating encapsulation 140'.

Figure 11H:
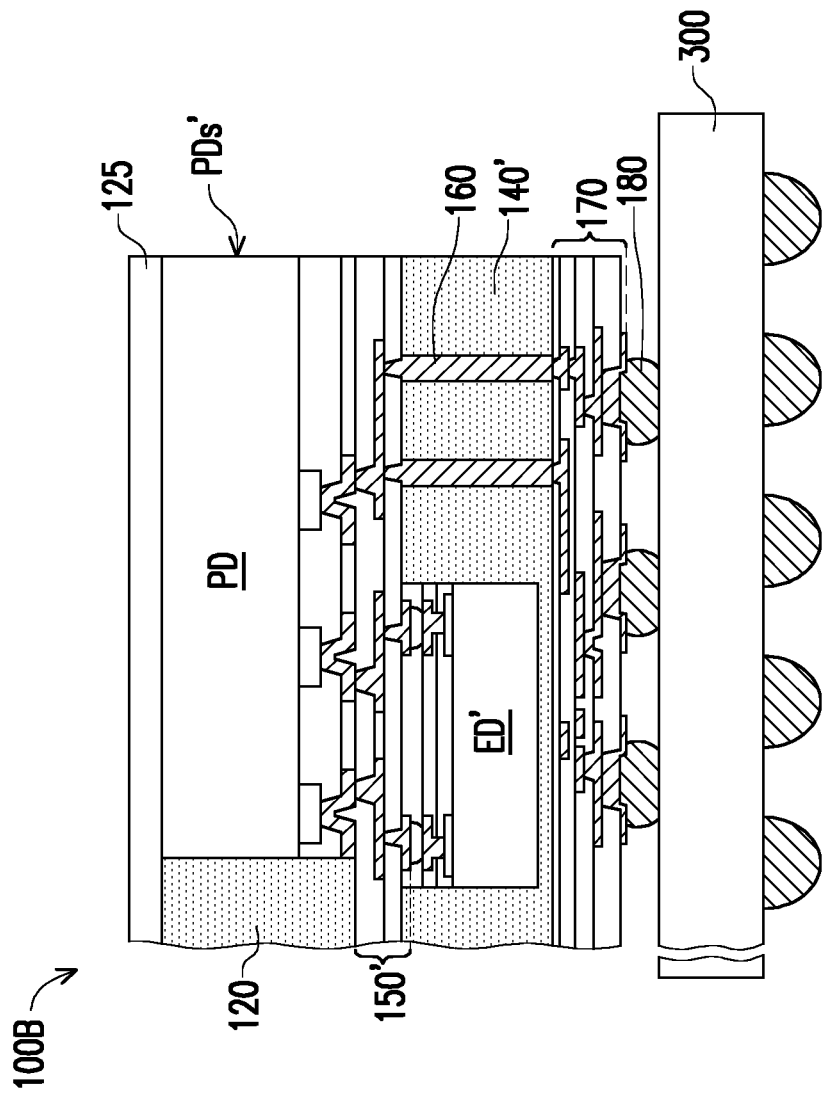
Figure 11I:
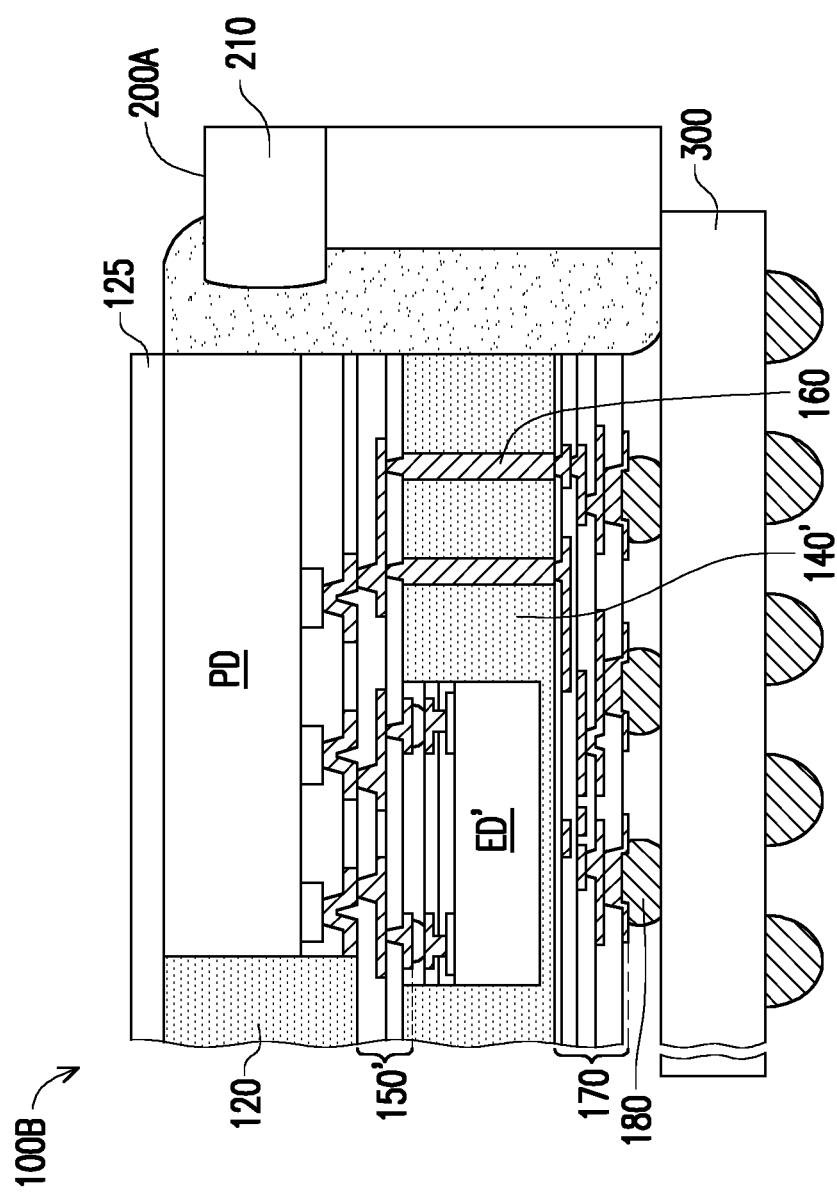

Referring to FIGS. 11H-11I, the first package component 100B is then mounted on the second package component 300. The mounting process may be similar to the process described in FIG. 10H. Subsequently, the optical signal port 200A is bonded to the first package component 100B and the second package component 300. The aligning and bonding techniques may be similar to the process described in FIG. 10I. In some embodiments, the optical signal port 200A is replaced with the optical signal port 200B. The first package component 100B with the electronic die ED' and the photonic die PD arranged in a face-to-face manner may provide optimal integration with high-speed and low power operation. It is noted that in accordance with various embodiments discussed above, some of the components in the first package component have different variations.

According to some embodiments, a package assembly includes a first package component and an optical signal port disposed aside the first package component. The first package component includes a first die including an electronic integrated circuit, a first insulating encapsulation laterally covering the first die, a redistribution structure disposed on the first die and the first insulating encapsulation, and a second die including a photonic integrated circuit and electrically coupled to the first die through the redistribution structure. The optical signal port is optically coupled to an edge facet of the second die of the first package component.

According to some alternative embodiments, a package assembly includes a first package component an optical signal port disposed aside the first package component. The first package component includes an electronic die encapsulated by a first insulating encapsulation, and a photonic die stacked over and electrically coupled to the electronic die. The photonic die is partially covered by a second insulating encapsulation, where a sidewall of the photonic die is substantially leveled with a sidewall of the first insulating encapsulation. The optical signal port faces the sidewall of the photonic die to optically coupling the photonic die.

According to some alternative embodiments, a manufacturing method of a package assembly includes at least the following steps. A first redistribution structure is formed to electrically couple an electronic die and a photonic die encapsulated by an insulating encapsulation. The first redistribution structure and the photonic die are cut through to form an outer sidewall of a package component. A fiber is aligned with the outer sidewall of the package component corresponding to the photonic die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package assembly, comprising:
   a first package component comprising:

a first die comprising an electronic integrated circuit;
a first insulating encapsulation laterally covering the first die;
a redistribution structure disposed on the first die and the first insulating encapsulation; and
a second die comprising a photonic integrated circuit and electrically coupled to the first die through the redistribution structure; and
a second insulating encapsulation disposed over the first insulating encapsulation, wherein a first vertical sidewall of the second die is covered by the second insulating encapsulation; and
an optical signal port disposed aside the first package component and optically coupled to an edge facet of the second die of the first package component.

2. The package assembly as claimed in claim 1, wherein the second die is stacked over the first die, and
a second vertical sidewall of the second die is covered by the optical signal port.

3. The package assembly as claimed in claim 1, wherein the second die of the first package component further comprises:
an edge coupler disposed corresponding to the edge facet of the second die to optically coupling a fiber of the optical signal port; and
a fiber mesa disposed under the fiber to support the fiber.

4. The package assembly as claimed in claim 1, wherein the second die is stacked over the first die, an active surface of the second die faces a back surface of the first die, and the first package component further comprises:
a through insulating via penetrating through the first insulating encapsulation, wherein the second die is electrically coupled to the first die through the redistribution structure and the through insulating via.

5. The package assembly as claimed in claim 1, wherein the second die is stacked over the first die, and the package assembly further comprising:
a second package component separately disposed aside the first package component and opposite to the optical signal port, the second package component comprising at least one third die; and
a third package component carrying the first package component and the second package component thereon, wherein the at least one third die of the second package component is electrically coupled to the first die of the first package component through the third package component.

6. The package assembly as claimed in claim 1, wherein a vertical sidewall of the second insulating encapsulation is substantially flush with a vertical sidewall of the first insulating encapsulation.

7. The package assembly as claimed in claim 1, wherein the optical signal port comprises:
a fiber aligned with the edge facet of the second die; and
an optical interface layer interposed between the fiber and the edge facet of the second die.

8. The package assembly as claimed in claim 7, further comprising:
a second package component carrying and electrically coupled to the first package component, wherein the optical interface layer extends into a gap between the first package component and the second package.

9. The package assembly as claimed in claim 1, wherein a second vertical sidewall of the second die is substantially leveled with a vertical sidewall of the first insulating encapsulation.

10. The package assembly as claimed in claim 9, wherein the second vertical sidewall of the second die is further substantially leveled with a vertical sidewall of the redistribution structure.

11. A package assembly, comprising:
a first package component comprising:
an electronic die encapsulated by a first insulating encapsulation; and
a photonic die stacked over and electrically coupled to the electronic die, wherein a first vertical sidewall of the photonic die is covered by a second insulating encapsulation; and
an optical signal port disposed aside the first package component and facing a second vertical sidewall of the photonic die to optically coupling the photonic die.

12. The package assembly as claimed in claim 11, wherein the photonic die of the first package component comprises:
a dielectric layer disposed over a substrate;
an edge coupler disposed over the substrate and embedded in the dielectric layer; and
an optical interface layer disposed in a recess of the substrate and extending to laterally correspond the edge coupler, wherein the photonic die comprises an edge facet formed by an outer sidewall of the optical interface layer.

13. The package assembly as claimed in claim 11, wherein an active surface of the photonic die faces a back surface of the electronic die, and the first package component further comprises:
a first redistribution structure interposed between the first insulating encapsulation and the second insulating encapsulation;
a through insulating via penetrating through the first insulating encapsulation; and
a second redistribution structure disposed on the first insulating encapsulation, wherein the photonic die is electrically coupled to the electronic die through the first redistribution structure, the through insulating via, and the second redistribution structure.

14. The package assembly as claimed in claim 11, wherein the second vertical sidewall of the photonic die is substantially leveled with a vertical sidewall of the first insulating encapsulation.

15. The package assembly as claimed in claim 11, wherein the optical signal port comprises:
a fiber aligned with an edge facet of the second vertical sidewall of the photonic die; and
an optical interface layer interposed between the fiber and the second vertical sidewall of the photonic die.

16. The package assembly as claimed in claim 15, further comprising:
a second package component carrying and electrically coupled to the first package component, wherein the optical interface layer extends into a gap between the first package component and the second package.

17. A package assembly, comprising:
a first package component comprising:
a first die comprising an electronic integrated circuit;
a first insulating encapsulation laterally covering the first die;
a redistribution structure disposed on the first die and the first insulating encapsulation; and
a second die electrically coupled to the first die through the redistribution structure and comprising:
a photonic integrated circuit;
an edge coupler disposed corresponding to an edge facet of the second die;

an optical signal port disposed aside the first package component, comprising a fiber and a fiber mesa, wherein the fiber mesa is disposed under the fiber to support the fiber, wherein the edge coupler optically couples the fiber of the optical signal port, wherein the second die further comprises a substrate and a dielectric layer over substrate, and the edge coupler is disposed over the substrate and embedded in the dielectric layer.

18. The package assembly as claimed in claim 17, wherein the optical signal port further comprises an optical interface layer interposed between the fiber and the second die.

19. The package assembly as claimed in claim 17, wherein the second die further comprises an optical interface layer disposed in a recess of the substrate and extending to laterally correspond the edge coupler, and the edge facet of the second die is formed by an outer sidewall of the optical interface layer.

20. The package assembly as claimed in claim 17, wherein a vertical sidewall of the first insulating encapsulation is substantially flush with a vertical sidewall of the second die.

* * * * *